United States Patent
Liu et al.

(10) Patent No.: US 10,679,985 B2
(45) Date of Patent: Jun. 9, 2020

(54) THREE-DIMENSIONAL MEMORY DEVICE HAVING SEMICONDUCTOR PLUG FORMED USING BACKSIDE SUBSTRATE THINNING

(71) Applicant: YANGTZE MEMORY TECHNOLOGIES CO., LTD., Wuhan (CN)

(72) Inventors: Shasha Liu, Wuhan (CN); Li Hong Xiao, Wuhan (CN); EnBo Wang, Wuhan (CN); Feng Lu, Wuhan (CN); Qianbin Xu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 19 days.

(21) Appl. No.: 16/194,309

(22) Filed: Nov. 17, 2018

(65) Prior Publication Data

US 2020/0126974 A1 Apr. 23, 2020

Related U.S. Application Data

(63) Continuation of application No. PCT/CN2018/111391, filed on Oct. 23, 2018.

(51) Int. Cl.
*H01L 29/76* (2006.01)
*H01L 27/06* (2006.01)
(Continued)

(52) U.S. Cl.
CPC ...... *H01L 27/0688* (2013.01); *G11C 16/0483* (2013.01); *H01L 21/8221* (2013.01);
(Continued)

(58) Field of Classification Search
CPC ............ H01L 21/8221; H01L 23/3114; H01L 27/11565; H01L 27/11578; H01L 27/0688; H01L 27/11551
(Continued)

(56) References Cited

U.S. PATENT DOCUMENTS 9,324,727 B2 * 4/2016 Lee .................. H01L 27/11582
9,543,316 B2 * 1/2017 Lee .................. H01L 27/11565
(Continued)

FOREIGN PATENT DOCUMENTS

CN 105047668 A 11/2015
CN 106653684 A 5/2017
(Continued)

OTHER PUBLICATIONS

International Search Report issued in corresponding International Application No. PCT/CN2018/111391, dated Jun. 28, 2019, 5 pages.
(Continued)

*Primary Examiner* — Luan C Thai
(74) *Attorney, Agent, or Firm* — Bayes PLLC

(57) ABSTRACT

Embodiments of 3D memory devices and methods for forming the same are disclosed. In an example, a 3D memory device includes a memory stack including interleaved conductive layers and dielectric layers, a channel structure extending vertically through the memory stack, and a semiconductor layer above the memory stack. The channel structure includes a channel plug in a lower portion of the channel structure, a memory film along a sidewall of the channel structure, and a semiconductor channel over the memory film and in contact with the channel plug. The semiconductor layer includes a semiconductor plug above and in contact with the semiconductor channel.

20 Claims, 18 Drawing Sheets

(51) Int. Cl.
  *H01L 27/10* (2006.01)
  *H01L 27/11565* (2017.01)
  *G11C 16/04* (2006.01)
  *H01L 27/11551* (2017.01)
  *H01L 23/31* (2006.01)
  *H01L 21/822* (2006.01)
  *H01L 27/11578* (2017.01)

(52) U.S. Cl.
  CPC ........ *H01L 23/3114* (2013.01); *H01L 27/101* (2013.01); *H01L 27/11551* (2013.01); *H01L 27/11565* (2013.01); *H01L 27/11578* (2013.01)

(58) Field of Classification Search
  USPC .......................................................... 257/314
  See application file for complete search history.

(56) References Cited

U.S. PATENT DOCUMENTS 9,576,967 B1 * 2/2017 Kimura ............. H01L 27/11582
2010/0019310 A1 1/2010 Sakamoto
2010/0232224 A1 9/2010 Maeda et al.
2016/0225621 A1 8/2016 Seo et al.
2017/0117222 A1 4/2017 Kim et al.
2017/0271352 A1 9/2017 Nakamura
2018/0083033 A1 3/2018 Arai
2018/0226426 A1 8/2018 Purayath

FOREIGN PATENT DOCUMENTS

| CN | 107039443 A | 8/2017 |
| CN | 107887395 A | 4/2018 |
| CN | 107994027 A | 5/2018 |
| CN | 108565266 A | 9/2018 |

OTHER PUBLICATIONS

Written Opinion of the International Searching Authority issued in corresponding International Application No. PCT/CN2018/111391, dated Jun. 28, 2019, 4 pages.

* cited by examiner

THREE-DIMENSIONAL MEMORY DEVICE HAVING SEMICONDUCTOR PLUG FORMED USING BACKSIDE SUBSTRATE THINNING

CROSS REFERENCE TO RELATED APPLICATION

This application is continuation of International Application No. PCT/CN2018/111391, filed on Oct. 23, 2018, entitled "THREE-DIMENSIONAL MEMORY DEVICE HAVING SEMICONDUCTOR PLUG FORMED USING BACKSIDE SUBSTRATE THINNING," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a memory stack including interleaved conductive layers and dielectric layers, a channel structure extending vertically through the memory stack, and a semiconductor layer above the memory stack. The channel structure includes a channel plug in a lower portion of the channel structure, a memory film along a sidewall of the channel structure, and a semiconductor channel over the memory film and in contact with the channel plug. The semiconductor layer includes a semiconductor plug above and in contact with the semiconductor channel.

In another example, a 3D memory device includes a first memory deck including a first plurality of interleaved conductive layers and dielectric layers, an etch stop layer on the first memory deck, a second memory deck including a second plurality of interleaved conductive layers and dielectric layers on the etch stop layer, a channel structure extending vertically through the first and second memory decks and the etch stop layer, and a semiconductor plug above a top surface of the second memory deck and in contact with the channel structure.

In still another example, a method for forming a 3D memory device is disclosed. A dielectric stack including interleaved sacrificial layers and dielectric layers is formed on a front side of a first substrate. A channel hole is formed through the dielectric stack. A memory film and a semiconductor channel are formed along a sidewall and on a bottom surface of the channel hole. A memory stack including interleaved conductive layers and dielectric layers is formed by replacing the sacrificial layers in the dielectric stack with the conductive layers. The first substrate is attached to a second substrate. The front side of the first substrate is toward the second substrate. The first substrate is thinned from a backside of the first substrate to remove parts of the memory film and semiconductor channel on the bottom surface of the channel hole. A semiconductor plug is formed in the thinned first substrate to contact the semiconductor channel.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
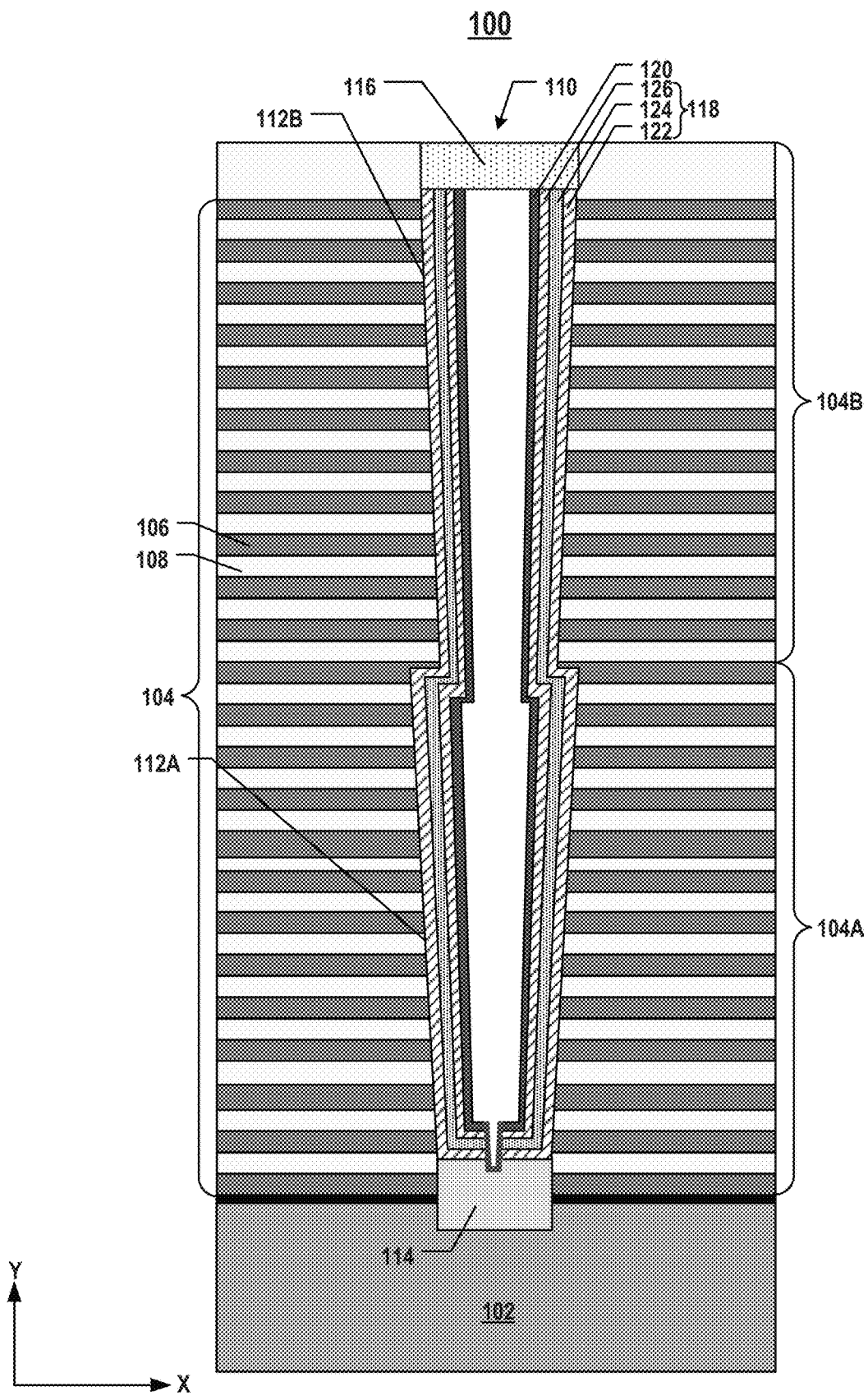
FIG. 1 illustrates a cross-section of an exemplary 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a semiconductor plug is typically formed at one end of a NAND memory string, which acts as the channel of a transistor to control the source of the NAND memory string. In fabricating 3D NAND memory devices with advanced technologies, such as having 96 or more levels, a dual-deck architecture is usually used, which requires removal of a sacrificial layer that temporarily fills the lower channel hole in the lower deck above the semiconductor plug and filling of both lower and upper channel holes together at once with memory film and semiconductor channel (known as "single channel formation" (SCF)).

For example, FIG. 1 illustrates a cross-section of an exemplary 3D memory device 100 at a fabrication stage for forming a NAND memory string 110 extending vertically through a dual-deck dielectric stack 104 (including a lower dielectric deck 104A and an upper dielectric deck 104B) above a substrate 102. Each of lower and upper dielectric decks 104A and 104B includes a plurality of pairs each including a sacrificial layer 106 and a dielectric layer 108 (referred to herein as "dielectric layer pairs"). Once all the fabrication processes are finished, dielectric stack 104 is replaced with a memory stack by a gate replacement process, which replaces each sacrificial layer 106 with a conductive layer. NAND memory string 110 includes a lower channel structure 112A and an upper channel structure 112B formed through lower dielectric deck 104A and upper dielectric deck 104B, respectively. NAND memory string 110 also includes a semiconductor plug 114 at its lower end and a channel plug 116 at its upper end. As shown in FIG. 1, semiconductor plug 114 extends into part of substrate 102, i.e., below the top surface of substrate 102.

Lower channel structure 112A and upper channel structure 112B (collectively referred to as "channel structure" 112) includes a memory film 118 and a semiconductor channel 120 along its sidewall and on its bottom surface. In order to contact semiconductor channel 120 to semiconductor plug 114 underneath memory film 118, a "SONO punch" process needs to be performed to etch through a blocking layer 122, a storage layer 124, and a tunneling layer 126 forming memory film 118 and a channel sacrificial layer (not shown) on the bottom surface of lower channel structure 112A. Since the SONO punch process uses high-energy etchant plasma, there is a narrow process margin (e.g., less than 10 nm) for upper channel structure 112B and lower channel structure 112A to overlay at their joint location to avoid sidewall damages at the joint location and/or under-etch on the bottom surface.

Further, to form semiconductor plug 114 and accommodate the SONO punch process, the channel sacrificial layer needs to be first deposited over memory film 118, then etched back to form a recess for channel plug 116, and eventually replaced by semiconductor channel 120, which increases process complexity and cost. The use of the channel sacrificial layer also reduces the yield because of the void formation and wafer bow and warpage issues caused by filling the channel sacrificial layer. In some situations, the removal of the channel sacrificial layer may also cause damages to semiconductor plug 114 underneath and/or leave residuals in the channel hole, which can directly lead to cell function failure.

Various embodiments in accordance with the present disclosure provide a backside substrate thinning process, which can replace the conventional SONO punch process, for forming a semiconductor plug in 3D memory devices. The process can release more margin for upper channel hole overlay, thereby easing the challenges of photolithograph alignment and etching processes in making the upper channel hole. The elimination of the SONO punch process and channel sacrificial layer can reduce the cell malfunction risk caused by bottom under-etch, sidewall and semiconductor plug damages, channel hole residuals, etc. Further, in some embodiments, an etch stop layer is formed between upper and lower dielectric decks to reduce the risk of damaging the dielectric layer pairs in the lower dielectric deck caused by the shift of upper channel hole overlay.

Figure 2A:
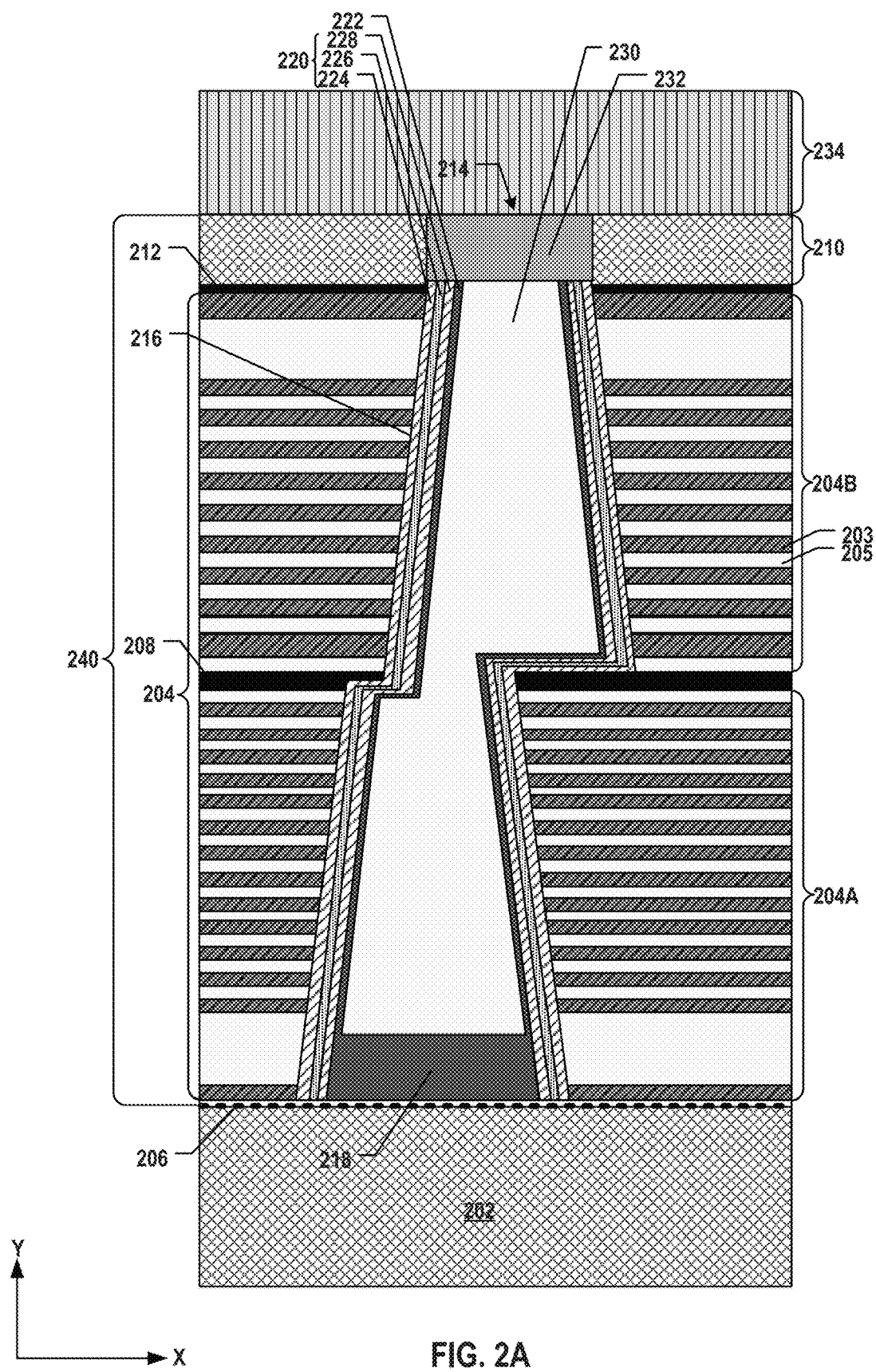
FIG. 2A illustrates a cross-section of an exemplary 3D memory device, according to some embodiments of the present disclosure.

FIG. 2A illustrates a cross-section of an exemplary 3D memory device 200, according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), germanium on insulator (GOI), glass, quartz, or any other suitable materials. In some embodiments, substrate 202 is a carrier substrate. As described below in detail, the carrier substrate can be attached to the front side of a thinned memory array device chip 240 at a joining interface 206 using any suitable joining processes, such as bonding, adhesion, fusion, etc. It is understood that in some embodiments, the carrier substrate is removed from 3D memory device 200 after the formation of thinned memory array device chip 240. As shown in FIG. 2A, thinned memory array device chip 240 can include a memory stack 204 (including a first memory deck 204A, an etch stop layer 208 on first memory deck 204, and a second memory deck 204B on etch stop layer 208) and a semiconductor layer 210 (e.g., a thinned substrate) above memory stack 204. Semiconductor layer 210 can be formed by thinning a substrate using grinding, chemical mechanical polishing (CMP), and/or etching processes. In some embodiments, joining interface 206 is vertically between substrate 202 and memory stack 204. An insulation layer 212, such as a dielectric layer, is disposed vertically between memory stack 204 and semiconductor layer 210, according to some embodiments.

It is noted that x and y axes are included in FIG. 2A to further illustrate the spatial relationship of the components in 3D memory device 200. Substrate 202 of 3D memory device 200 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 200) is determined relative to the substrate of the 3D memory device (e.g., substrate 202) in the y-direction (i.e., the vertical direction) when the substrate is positioned in the lowest plane of the 3D memory device in the y-direction. The same notion for describing spatial relationship is applied throughout the present disclosure.

In some embodiments, 3D memory device 200 is a NAND Flash memory device in which memory cells are provided in the form of array of NAND memory strings 214 extending vertically above substrate 202. The memory array device can include NAND memory strings 214 that extend through a plurality of pairs each including a conductive layer 203 and a dielectric layer 205 (referred to herein as "conductor/dielectric layer pairs"). The stacked conductive/dielectric layer pairs are also referred to herein as memory stack 204. The number of the conductive/dielectric layer pairs in memory stack 204 (e.g., 32, 64, 96, or 128) determines the number of memory cells in 3D memory device 200. Memory stack 204 can include a plurality of interleaved conductive layers 203 and dielectric layers 205. Conductive layers 203 and dielectric layers 205 in memory stack 204 can alternate in the vertical direction. Conductive layers 203 can include conductive materials including, but not limited to, tungsten (W), cobalt (Co), copper (Cu), aluminum (Al), polysilicon, doped silicon, silicides, or any combination thereof. Dielectric layers 205 can include dielectric materials including, but not limited to, silicon oxide, silicon nitride, silicon oxynitride, or any combination thereof.

In some embodiments, memory stack 204 has a dual-deck architecture, which includes first memory deck 204A and second memory deck 204B. The numbers of conductive/dielectric layer pairs in each of first and second memory decks 204A and 204B can be the same or different. Memory stack 204 can further include etch stop layer 208 disposed vertically between first memory deck 204A and second memory deck 204B. Etch stop layer 208 can include a metal, such as W, Co, Cu, Al, or any combination thereof. In one example, etch stop layer 208 is a tungsten layer. Etch stop layer 208 can also include a semiconductor, such as polysilicon, amorphous silicon, silicides, or any combination thereof. Etch stop layer 208 can include any other suitable materials that are different from the materials forming dielectric layers 205 (e.g., silicon oxide) and another type of dielectric layers (e.g., silicon nitride) replaced by conductive layers 203. The thickness of etch stop layer 208 can be between about 20 nm and about 30 nm, such as between 20 nm and 30 nm (e.g., 20 nm, 21 nm, 22 nm, 23 nm, 24 nm, 25 nm, 26 nm, 27 nm, 28 nm, 29 nm, 30 nm, any range bounded by the lower end by any of these values, or in any range defined by any two of these values). The thickness of etch stop layer 208 can be sufficiently thick to resist the etching in forming the channel hole through first memory deck 204A and also protect structures of second memory deck 204B from damages due to shift of channel hole overlay as described below in detail.

As shown in FIG. 2A, NAND memory string 214 can include a channel structure 216 extending vertically through memory stack 204. Channel structure 216 can include a channel hole having two openings overlaid one over another. Each opening is formed through one of first and second memory decks 204A and 204B, according to some embodiments. A shift of overlay can occur when the two openings are not precisely aligned, as shown in FIG. 2A. The channel hole can be filled with semiconductor material(s) (e.g., as a semiconductor channel 222) and dielectric material(s) (e.g., as a memory film 220). In some embodiments, semiconductor channel 222 includes silicon, such as amorphous silicon, polysilicon, or single crystalline silicon. In some embodiments, memory film 220 is a composite layer including a tunneling layer 228, a storage layer 226 (also known as a "charge trap layer"), and a blocking layer 224. The remaining space of channel structure 216 can be partially or fully filled with a capping layer 230 including dielectric materials, such as silicon oxide. Memory film 220 is disposed along the sidewall of channel structure 216, and semiconductor channel 222 is disposed over memory film 220, according to some embodiments. Channel structure 216 can have a cylinder shape (e.g., a pillar shape). Capping layer 230, semiconductor channel 222, tunneling layer 228, storage layer 226, and blocking layer 224 are arranged radially from the center toward the outer surface of the pillar in this order, according to some embodiments. Tunneling layer 228 can include silicon oxide, silicon oxynitride, or any combination thereof. Storage layer 226 can include silicon nitride, silicon oxynitride, silicon, or any combination thereof. Blocking layer 224 can include silicon oxide, silicon oxynitride, high dielectric constant (high-k) dielectrics, or any combination thereof. In one example, memory film 220 can include a composite layer of silicon oxide/silicon oxynitride (or silicon oxide)/silicon oxide ("ONO"), and semiconductor film can include a polysilicon layer ("S"), so that channel structure 216 can include a so-called "SONO" structure.

In some embodiments, conductive layer 203 in memory stack 204 functions as a gate conductor of memory cells in NAND memory string 214. Conductive layer 203 can include multiple control gates of multiple NAND memory cells and can extend laterally as a word line ending at the edge of memory stack 204 (e.g., in a staircase structure of memory stack 204). In some embodiments, memory cell transistors in NAND memory string 214 include gate conductors (i.e., parts of conductive layers 203 that abut channel structure 216) made from tungsten, adhesion layers (not shown) including titanium/titanium nitride (Ti/TiN) or tantalum/tantalum nitride (Ta/TaN), gate dielectric layers (not shown) made from high-k dielectric materials, and channel structure 216.

In some embodiments, channel structure 216 of NAND memory string 214 further includes a channel plug 218 in the lower portion (e.g., at the lower end) of NAND memory string 214. Channel plug 218 can be in contact with the lower portion of semiconductor channel 222. As used herein, the "upper end" of a component (e.g., NAND memory string 214) is the end farther away from substrate 202 in the y-direction, and the "lower end" of the component (e.g., NAND memory string 214) is the end closer to substrate 202 in the y-direction when substrate 202 is positioned in the lowest plane of 3D memory device 200. Channel plug 218 can include semiconductor materials (e.g., polysilicon) or conductive materials (e.g., metals). In some embodiments, channel plug 218 includes a recess filled with Ti/TiN or Ta/TaN as an adhesion layer and tungsten as a conductor layer. In some embodiments, channel plug 218 functions as the drain of NAND memory string 214.

In some embodiments, NAND memory string 214 further includes a semiconductor plug 232 in the upper portion (e.g., at the upper end) of NAND memory string 214. Semiconductor plug 232 can function as a channel controlled by a source select gate of NAND memory string 214. Different from FIG. 1 in which part of semiconductor plug 114 extends from substrate 102 into dielectric stack 104, as shown in FIG. 2A, the entirety of semiconductor plug 232 can be in semiconductor layer 210 and above the top surface of memory stack 204. In some embodiments, the bottom surface of semiconductor plug 232 is above the top surface of memory stack 204, and the top surface of semiconductor plug 232 is flush with the top surface of semiconductor layer 210. The thickness of semiconductor plug 232 can be equal to or less than the thickness of semiconductor layer 210.

As shown in FIG. 1, due to the SONO punch process for forming semiconductor plug 114, memory film 118 extends laterally along the bottom surface of lower channel structure 112A (i.e., the surface in contact with semiconductor plug 114), and semiconductor channel 120 extends through part of memory film 118 on the bottom surface of lower channel structure 112A and further into semiconductor plug 114 to make contact. By replacing the SONO punch process with a backside substrate thinning process for forming semiconductor plug 232, as shown in FIG. 2A, memory film 220 does not extend laterally along the top surface and the bottom surface of channel structure 216, and the upper end of semiconductor channel 222 is in contact with the bottom surface of semiconductor plug 232 to make contact. In some embodiments, semiconductor plug 232 is above and in contact with the upper end of channel structure 216 (and memory film 220 and semiconductor channel 222 thereof).

In some embodiments, semiconductor plug 232 is an epitaxially-grown silicon plug, which can be formed by a selective epitaxial growth (SEG) process, and thereby also known as a "SEG plug." Semiconductor plug 232 can include a semiconductor material, such as silicon, which is epitaxially grown from semiconductor layer 210. It is understood that in some embodiments, semiconductor layer 210 is a thinned silicon substrate on which memory stack 204 and channel structure 216 were formed, and semiconductor plug 232 includes single crystalline silicon, the same material of semiconductor layer 210. In other words, semiconductor plug 232 can include an epitaxially-grown semiconductor layer that is made of the same material as that of semiconductor layer 210. In some embodiments, semiconductor plug 232 can be doped with p-type or n-type dopants at a doping concentration higher than that of semiconductor layer 210. In some embodiments, semiconductor plug 232 is a deposited polysilicon plug or a silicide plug. Semiconductor plug 232 can include a recess in semiconductor layer 210 filled with polysilicon or filled with silicide by a self-aligned silicide (salicide) process, such as copper silicide, cobalt silicide, nickel silicide, titanium silicide, and tungsten silicide.

3D memory device 200 can be part of a non-monolithic 3D memory device, in which components (e.g., the peripheral device and memory array device) can be formed separately on different substrates and then bonded, for example, in a face-to-face manner. In some embodiments, 3D memory device 200 includes a peripheral device chip 234 having a peripheral device and a substrate. The peripheral device can include any suitable digital, analog, and/or mixed-signal peripheral circuits used for facilitating the operation of 3D memory device 200. For example, the peripheral device can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, the peripheral device is formed on the substrate of peripheral device chip 234 using complementary metal-oxide-semiconductor (CMOS) technology (also known as a "CMOS chip").

As shown in FIG. 2A, peripheral device chip 234 (and the peripheral device and substrate thereof) can be disposed above semiconductor layer 210 of thinned memory array device chip 240, for example, joined by the hybrid bonding process. Substrate 202 can thereby act as the device substrate of 3D memory device 200. It is understood that although not shown in FIG. 2A, in some embodiments, substrate 202 is a carrier substrate, which is later removed from the final product of 3D memory device 200. Peripheral device chip 234 can thereby be disposed below thinned memory array device chip 240, for example, joined by a hybrid bonding process. The substrate of peripheral device chip 234 can thus act as the device substrate of 3D memory device 200.

Although not shown in FIG. 2A, it is understood that 3D memory device 200 can further include an interconnect layer for middle-end-of-line (MEOL) interconnects and/or back-end-of-line (BEOL) interconnects. The interconnect layer can include interconnects, such as lateral interconnect lines and vertical via contacts in one or more interlayer dielectric (ILD) layers (also known as "intermetal dielectric (IMD) layers"). The interconnect layer can further include contact pads and redistribution layers for pad-out. In some embodiments, the interconnect layer transfers electrical signals between 3D memory device 200 and external circuits and is electrically connected to the memory array devices and/or peripheral devices by local interconnects. The interconnect layer can be disposed in any suitable position in 3D memory device 200, such as vertically between substrate 202 and thinned memory array device chip 240, vertically between thinned memory array device chip 240 and peripheral device chip 234, and/or above peripheral device chip 234.

Figure 2B:
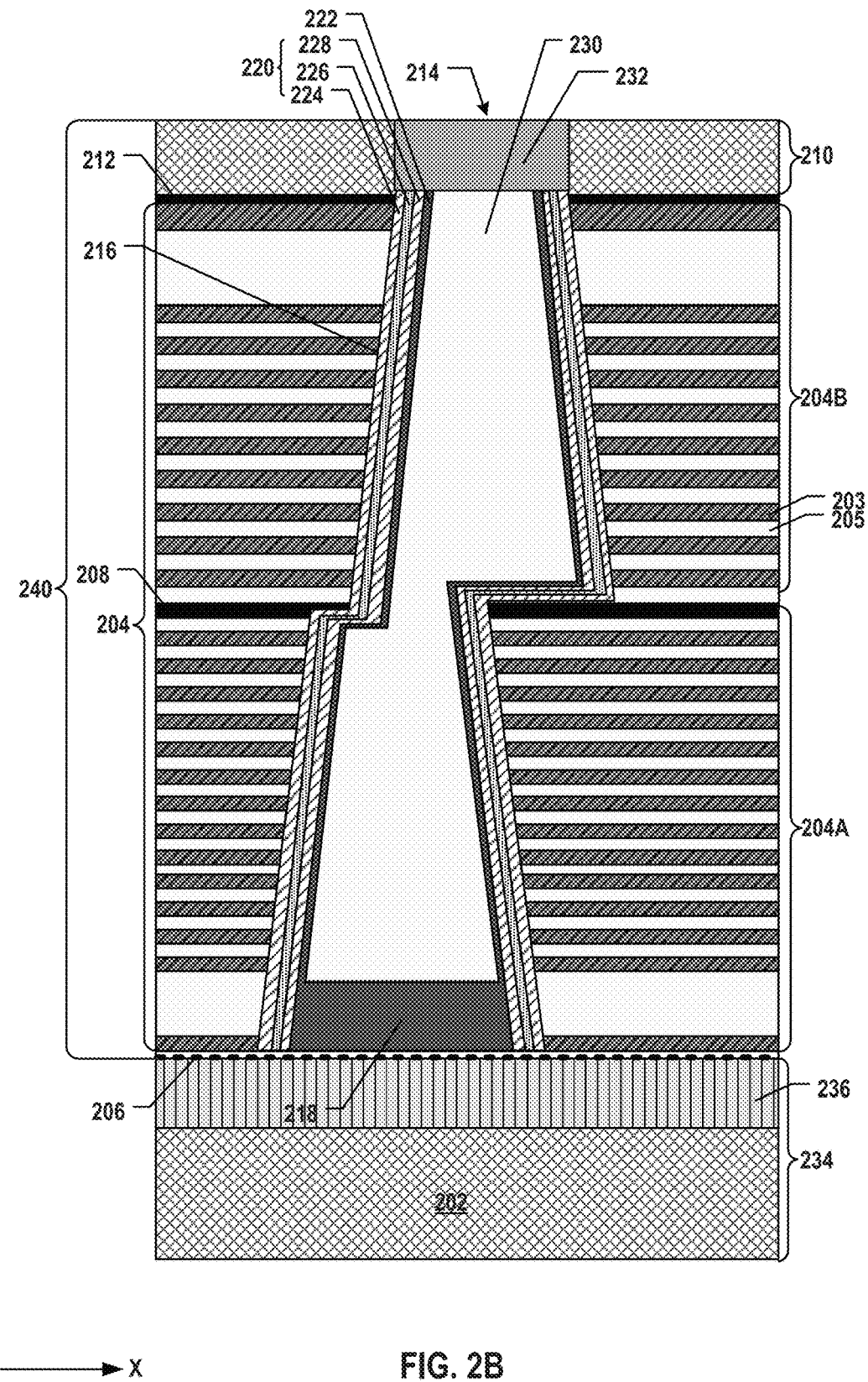
FIG. 2B illustrates a cross-section of another exemplary 3D memory device, according to some embodiments of the present disclosure.

FIG. 2B illustrates a cross-section of an exemplary 3D memory device 201, according to some embodiments of the present disclosure. Similar to 3D memory device 200 described above in FIG. 2A, 3D memory device 201 includes semiconductor plug 232 formed in semiconductor layer 210 using a backside substrate thinning process, instead of the SONO punch process. Different from 3D memory device 200 described above in FIG. 2A in which peripheral device chip 234 is disposed above thinned memory array device chip 240, in FIG. 2B, peripheral device chip 234 is disposed below thinned memory array device chip 240 in 3D memory device 201. It is understood that the details of counterpart structures (e.g., materials, fabrication process, functions, etc.) in both 3D memory devices 200 and 201 may not be repeated below.

Peripheral device chip 234 can include substrate 202 and peripheral device 236 formed on and/or in substrate 202. Substrate 202 is not a carrier substrate in this example and cannot be removed from the final product of 3D memory device 201. Rather, substrate 202 is the device substrate of 3D memory device 201 as well as the device substrate of peripheral device chip 234, according to some embodiments. Peripheral device 236 can include any suitable digital, analog, and/or mixed-signal peripheral circuits used for facilitating the operation of 3D memory device 201. For example, peripheral device 236 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). Peripheral device 236 is disposed vertically between substrate 202 and memory stack 204, according to some embodiments.

In some embodiments, peripheral device chip 234 (including peripheral device 236 and substrate 202 thereof) is bonded to thinned memory array device chip 240 in a face-to-face manner at joining interface 206. Joining interface 206 can be a bonding interface at which peripheral device chip 234 and thinned memory array device chip 240 are bonded using hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. Joining interface 206 is vertically between substrate 202 and memory stack 204.

Although not shown in FIG. 2B, it is understood that 3D memory device 201 can further include an interconnect layer for MEOL interconnects and/or BEOL interconnects. The interconnect layer can include interconnects, such as lateral interconnect lines and vertical via contacts in one or more ILD layers. The interconnect layer can further include contact pads and redistribution layers for pad-out. In some embodiments, the interconnect layer transfers electrical signals between 3D memory device 201 and external circuits and is electrically connected to the memory array devices and/or peripheral devices by local interconnects. The interconnect layer can be disposed in any suitable position in 3D memory device 201, such as vertically between peripheral device 236 and thinned memory array device chip 240, and/or above semiconductor layer 210 of thinned memory array device chip 240.

Figure 3A:
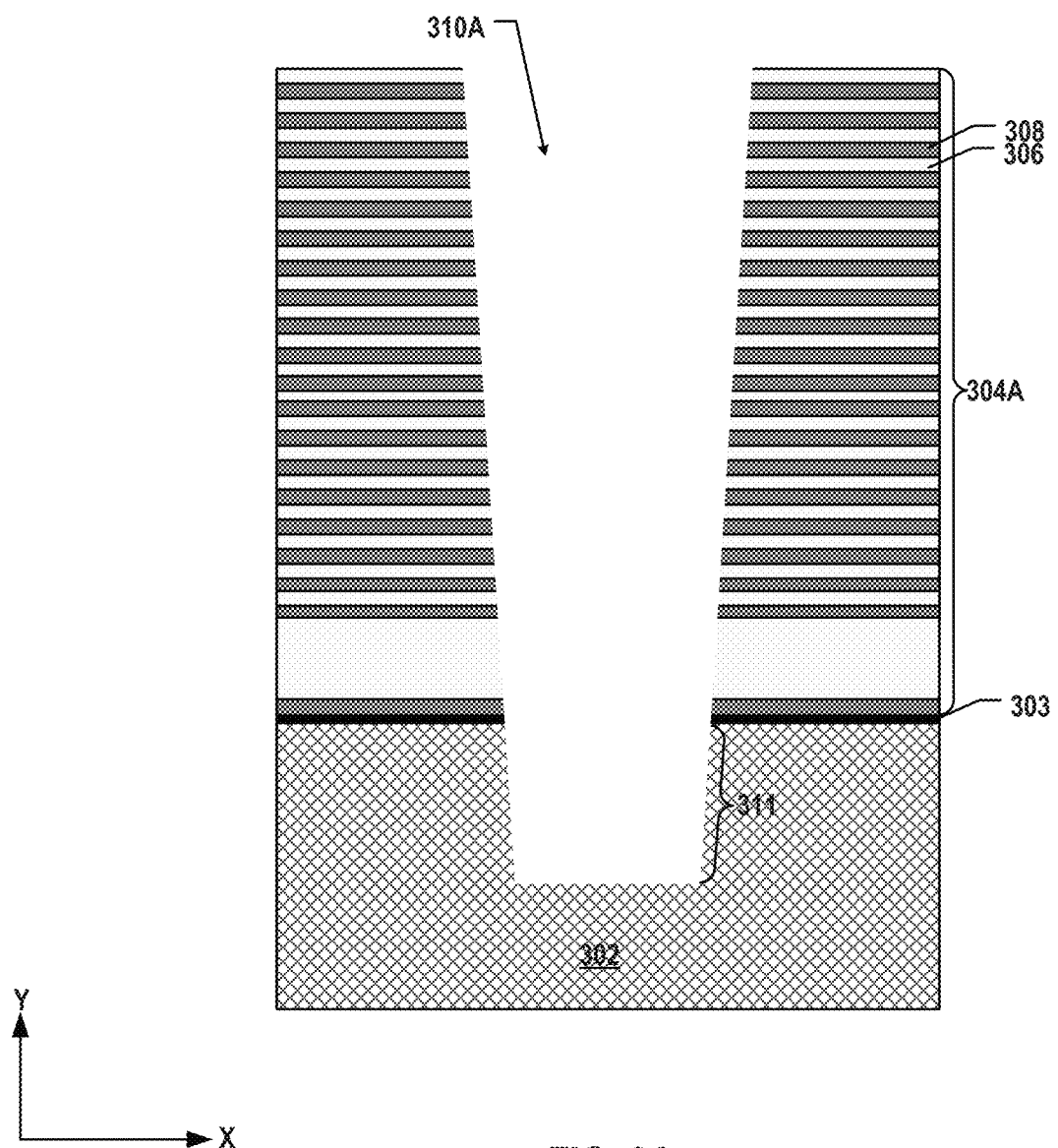
FIGS. 3A-3M illustrate an exemplary fabrication process for forming a 3D memory device having a semiconductor plug using backside substrate thinning, according to some embodiments of the present disclosure.

FIGS. 3A-3M illustrate an exemplary fabrication process for forming a 3D memory device having a semiconductor plug using backside substrate thinning, according to some embodiments of the present disclosure. FIGS. 4A-4B illustrate a flowchart of an exemplary method 400 for forming a 3D memory device having a semiconductor plug using backside substrate thinning, according to some embodiments of the present disclosure. Examples of the 3D memory device depicted in FIGS. 3A-3M and 4A-4B include 3D memory devices 200 and 201 depicted in FIGS. 2A-2B. FIGS. 3A-3M and 4A-4B will be described together. It is understood that the operations shown in method 400 are not exhaustive and that other operations can be performed as well before, after, or between any of the illustrated operations. Further, some of the operations may be performed simultaneously, or in a different order than shown in FIGS. 4A-4B.

Referring to FIG. 4A, method 400 starts at operation 402, in which a first dielectric deck is formed on a substrate. The substrate can be a silicon substrate. The first dielectric deck can include a first plurality of interleaved sacrificial layers and dielectric layers. Referring to FIG. 3A, a first dielectric deck 304A including a plurality pairs of a first dielectric layer 306 and a second dielectric layer (known as a "sacrificial layer") 308 (together referred to herein as "dielectric layer pairs") is formed on the front side of a silicon substrate 302. In some embodiments, an insulation layer 303 is formed between first dielectric deck 304A and silicon substrate 302 by depositing dielectric materials, such as silicon oxide, or thermal oxidation, on silicon substrate 302 prior to the formation of first dielectric deck 304A. First dielectric deck 304A includes interleaved sacrificial layers 308 and dielectric layers 306, according to some embodiments. Dielectric layers 306 and sacrificial layers 308 can be alternatively deposited on silicon substrate 302 to form first dielectric deck 304A. In some embodiments, each dielectric layer 306 includes a layer of silicon oxide, and each sacrificial layer 308 includes a layer of silicon nitride. First dielectric deck 304A can be formed by one or more thin film deposition processes including, but not limited to, chemical vapor deposition (CVD), physical vapor deposition (PVD), atomic layer deposition (ALD), or any combination thereof.

Method 400 proceeds to operation 404, as illustrated in FIG. 4A, in which a first opening extending vertically through the first dielectric deck is formed. In some embodiments, to form the first opening, a gouging is formed through part of the first substrate. In some embodiments, a sacrificial layer is formed to fill in the first opening.

As illustrated in FIG. 3A, a first channel hole 310A is an opening formed extending vertically through first dielectric deck 304A. In some embodiments, a plurality of openings are formed through first dielectric deck 304A, such that each opening becomes the location for forming an individual NAND memory string in the later process. In some embodiments, fabrication processes for forming first channel hole 310A include wet etching and/or dry etching, such as deep-ion reactive etching (DRIE). In some embodiments, first channel hole 310A extends further into the top portion of silicon substrate 302 to form a gouging 311 of first channel hole 310A. The etching process through first dielectric deck 304A may not stop at the top surface of silicon substrate 302 and may continue to etch part of silicon substrate 302. In some embodiments, a separate etching process is used to etch part of silicon substrate 302 to form gouging 311 after etching through first dielectric deck 304A. As described below in detail, the depth of gouging 311 of first channel hole 310A is greater than gouging of any other structure through silicon substrate 302, such as the slit openings and contact openings, to ensure that the later backside substrate thinning process would not damage other structures.

Figure 3B:
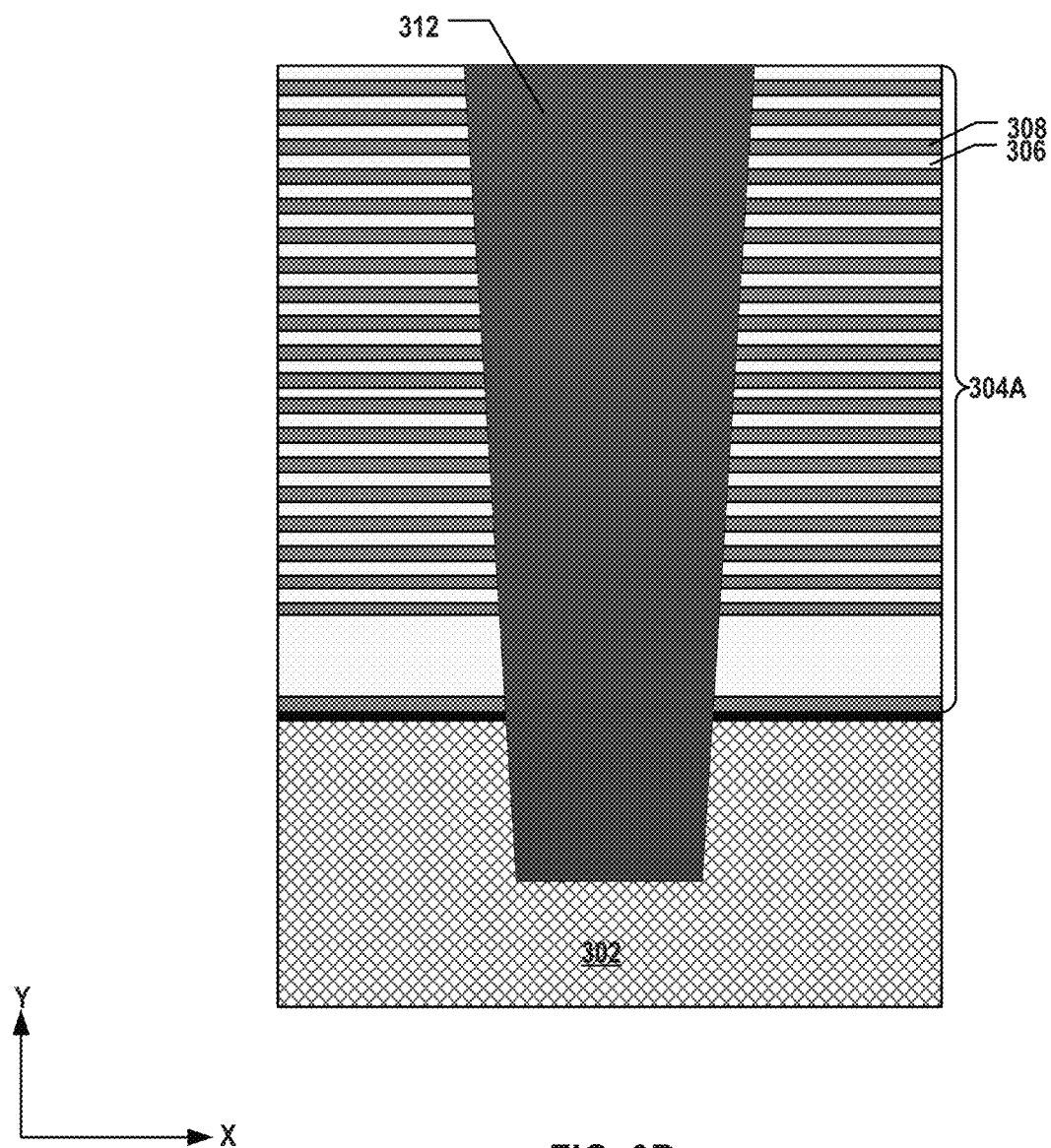
Figure 4A:
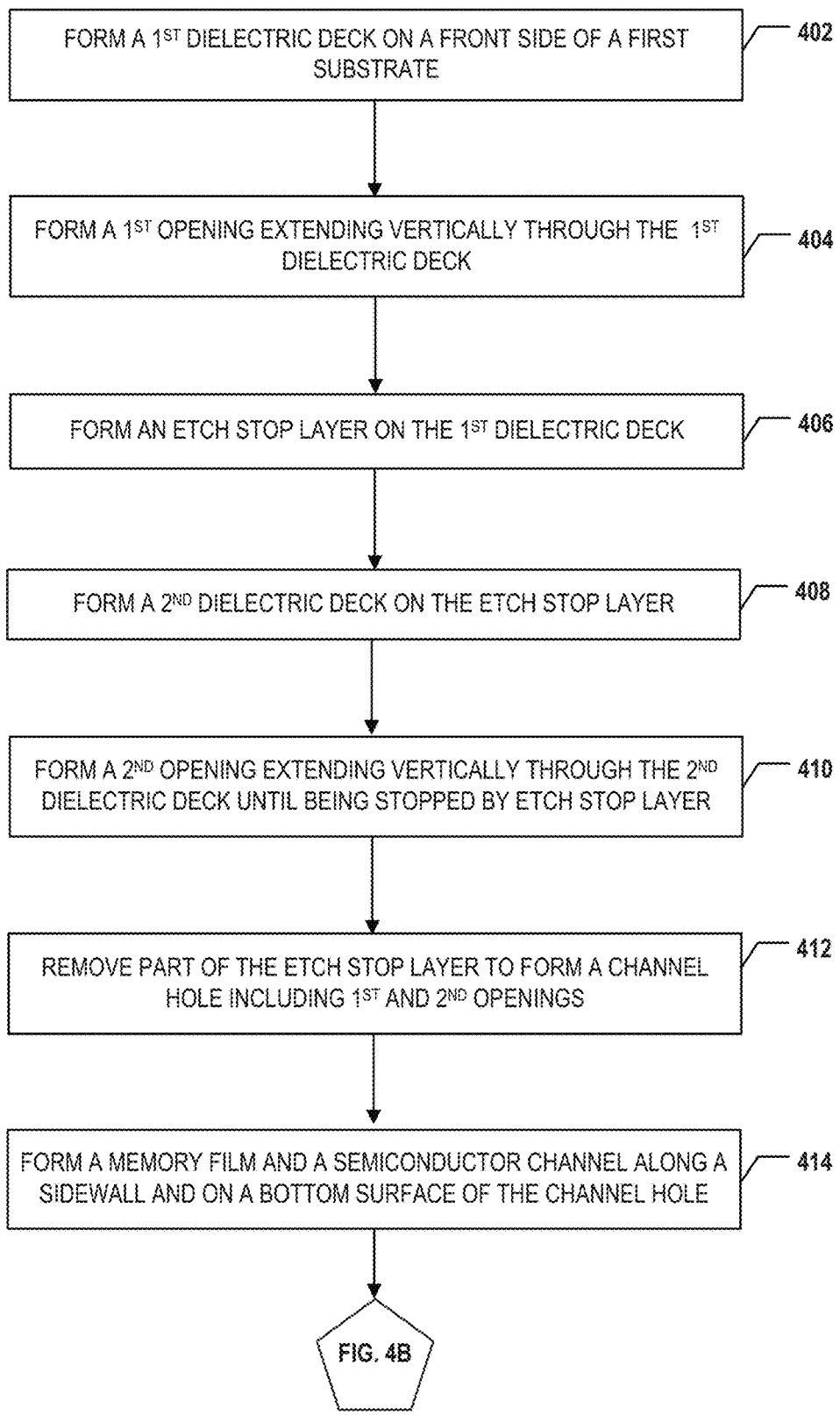
FIGS. 4A-4B illustrate a flowchart of an exemplary method for forming a 3D memory device having a semiconductor plug using backside substrate thinning, according to some embodiments of the present disclosure.
Figure 4B:
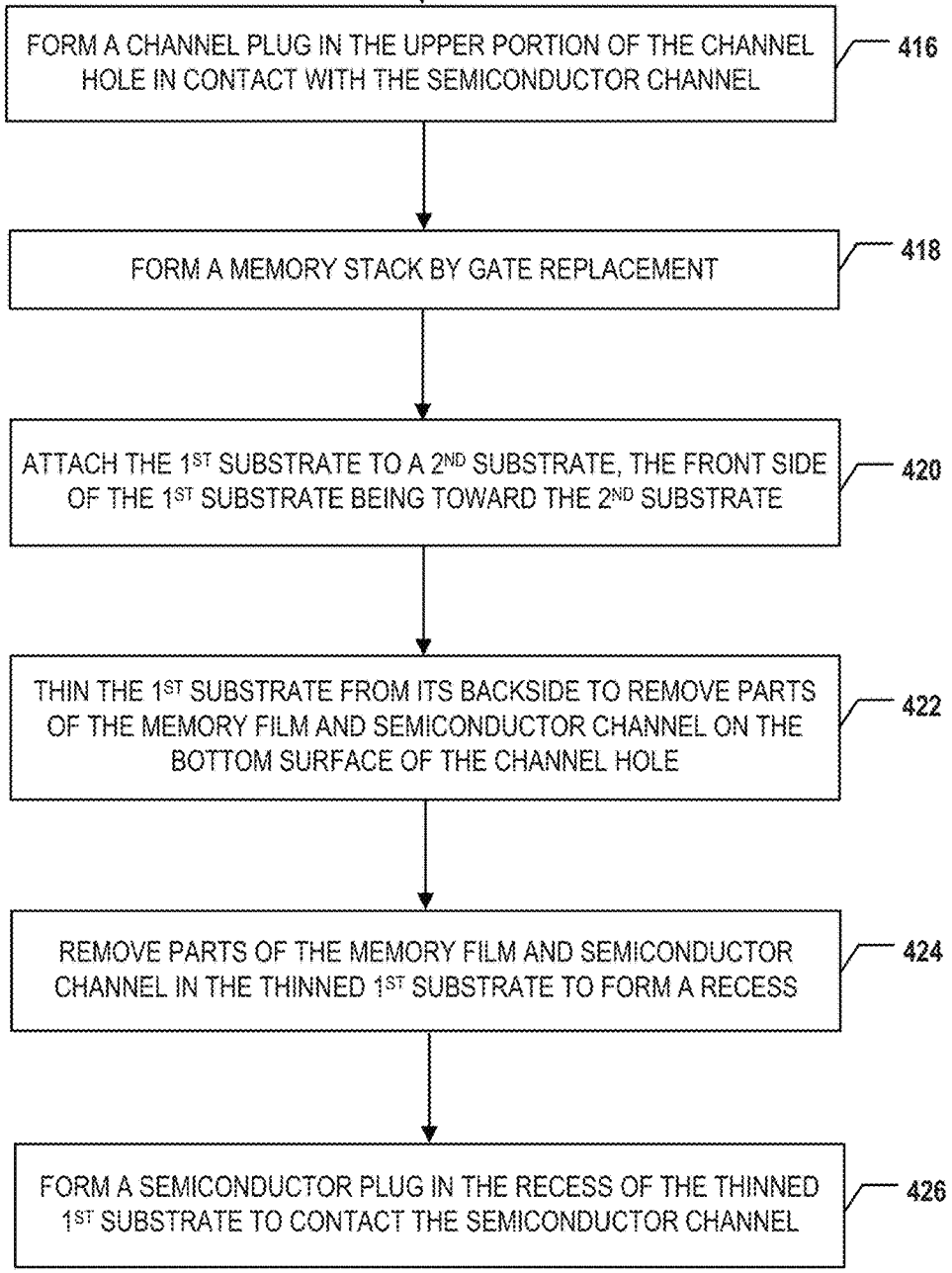

As illustrated in FIG. 3B, a sacrificial layer 312 is deposited using one or more thin film deposition processes, such as PVD, CVD, ALD, electroplating, electroless plating, or any combinations thereof, to partially or fully fill first channel hole 310A (including gouging 311, shown in FIG. 3A). Sacrificial layer 312 can include any suitable materials that can be removed in a later process, such as polysilicon, carbon, photoresist, etc. In some embodiments, sacrificial layer 312 is planarized using a CMP process to make its top surface flush with the top surface of first dielectric deck 304A.

Figure 3C:
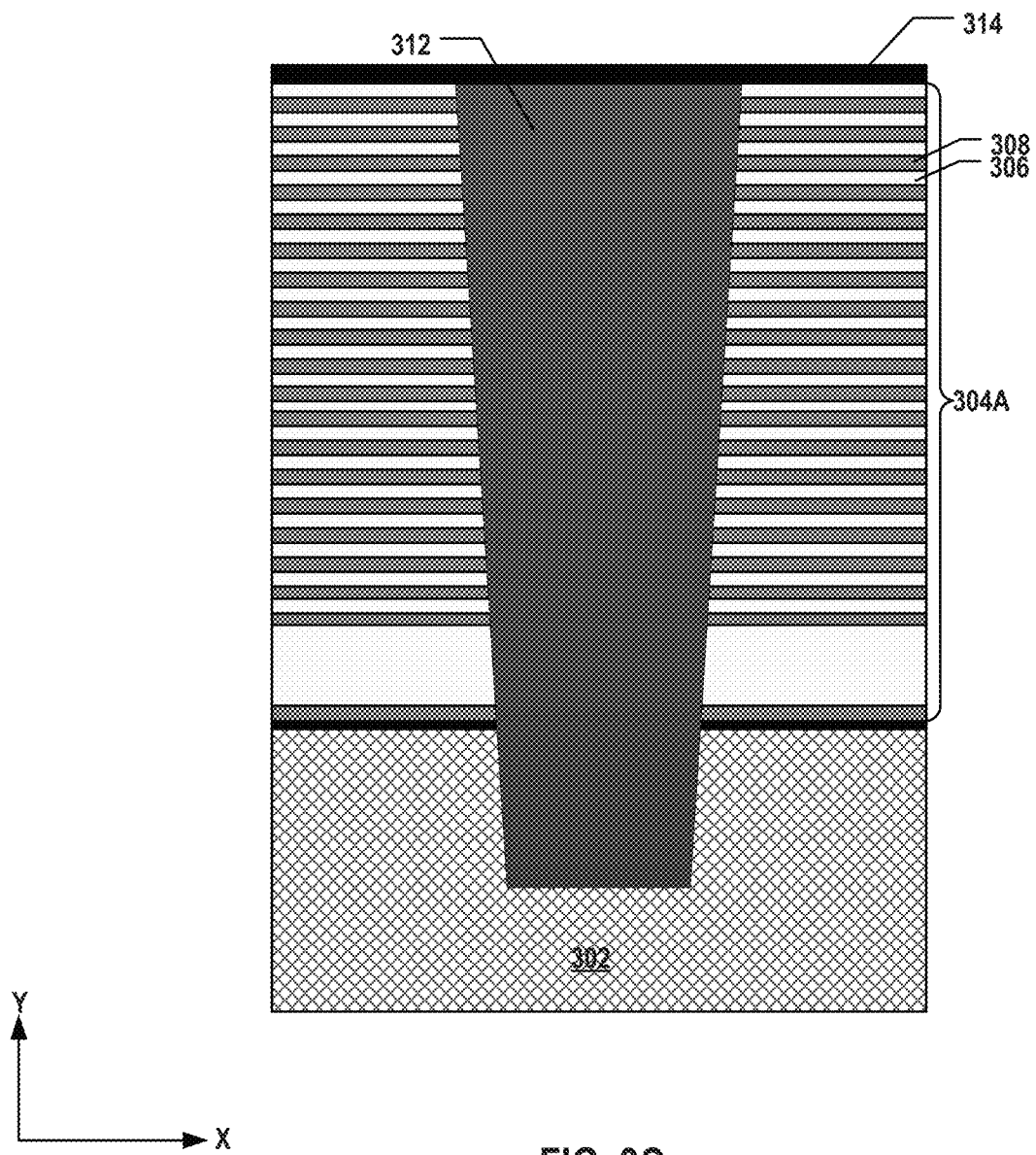

Method 400 proceeds to operation 406, as illustrated in FIG. 4A, in which an etch stop layer is formed on the first dielectric deck to cover the first dielectric deck. In some embodiments, the etch stop layer covers the sacrificial layer in the first opening as well. As illustrated in FIG. 3C, an etch stop layer 314 is formed on first dielectric deck 304A and sacrificial layer 312 to completely cover first dielectric deck 304A and sacrificial layer 312. In some embodiments, the thickness of etch stop layer 314 is between about 1 nm and about 20 nm, such as between 1 nm and 20 nm (e.g., 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, any range bounded by the lower end by any of these values, or in any range defined by any two of these values). Etch stop layer 314 can be formed by depositing a metal, such as tungsten, or a semiconductor, such as polysilicon, using one or more thin film deposition processes, such as PVD, CVD, ALD, or any combinations thereof.

Figure 3D:
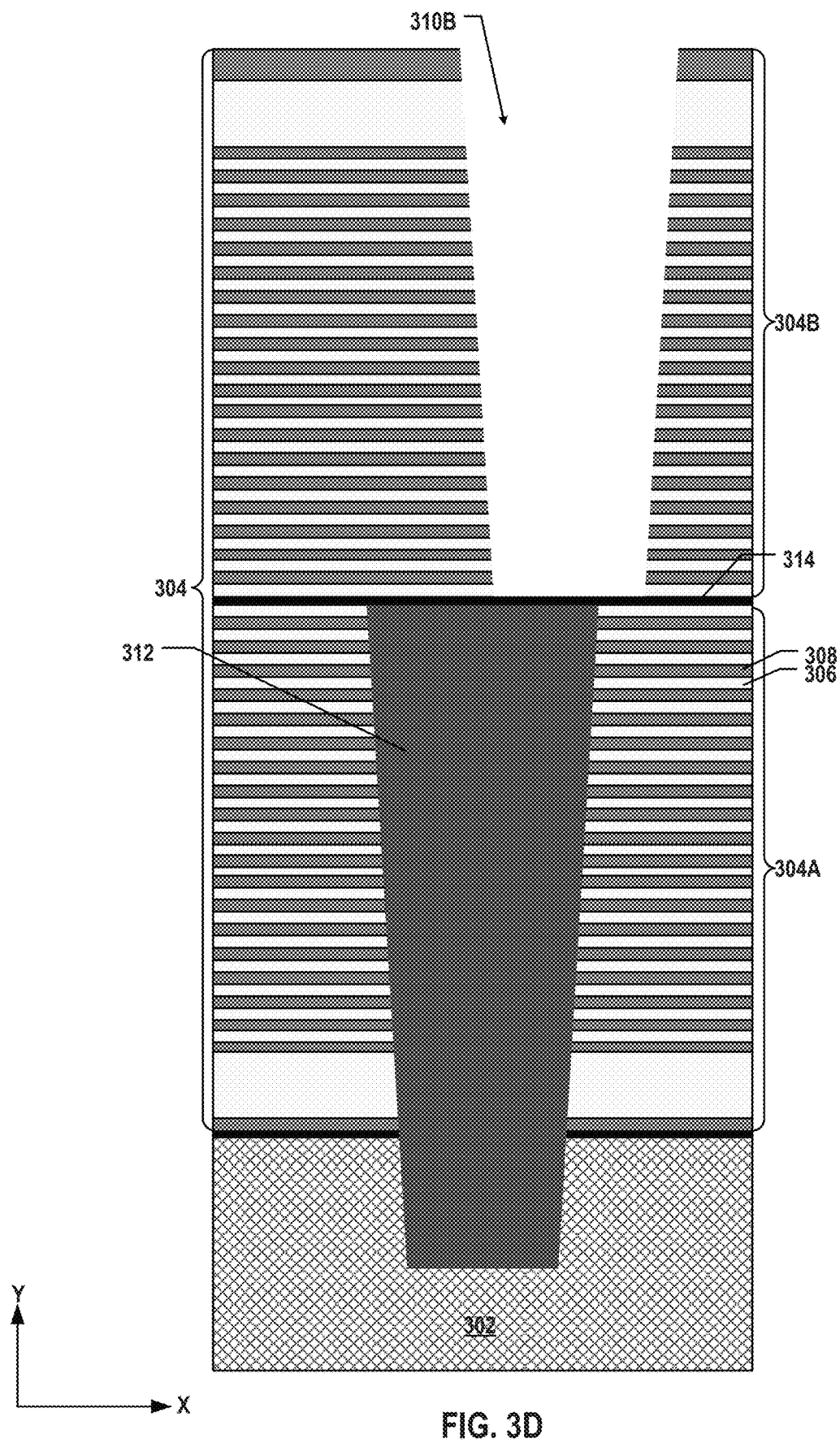

Method 400 proceeds to operation 408, as illustrated in FIG. 4A, in which a second dielectric deck is formed on the etch stop layer. Similar to the first dielectric deck, the second dielectric deck can include a second plurality of interleaved sacrificial layers and dielectric layers. Referring to FIG. 3D, a second dielectric deck 304B including a plurality of dielectric layer pairs is formed on etch stop layer 314 above first dielectric deck 304A. Second dielectric deck 304B can be formed by one or more thin film deposition processes including, but not limited to, CVD, PVD, ALD, or any combination thereof.

Method 400 proceeds to operation 410, as illustrated in FIG. 4A, in which a second opening extending vertically through the second dielectric deck is formed until being stopped by the etch stop layer. As illustrated in FIG. 3D, a second channel hole 310B is another opening formed extending vertically through second dielectric deck 304B until being stopped by etch stop layer 314. Second channel hole 310B can be aligned with first channel hole 310A (shown in FIG. 3A) so as to overlay with at least part of first channel hole 310A, such that first and second channel holes 310A and 310B can be connected once sacrificial layer 312 is removed. In some embodiments, fabrication processes for forming second channel hole 310B include wet etching and/or dry etching, such as DRIE. Because etch stop layer 314 can protect structures of first dielectric deck 304A from damages due to the etching of second channel hole 310B, the misalignment margin (i.e., the shift of overlay) can be increased by the fabrication process disclosed herein, compared with the conventional fabrication process for forming dual-deck 3D memory devices (e.g., 3D memory device 100 in FIG. 1).

Figure 3E:
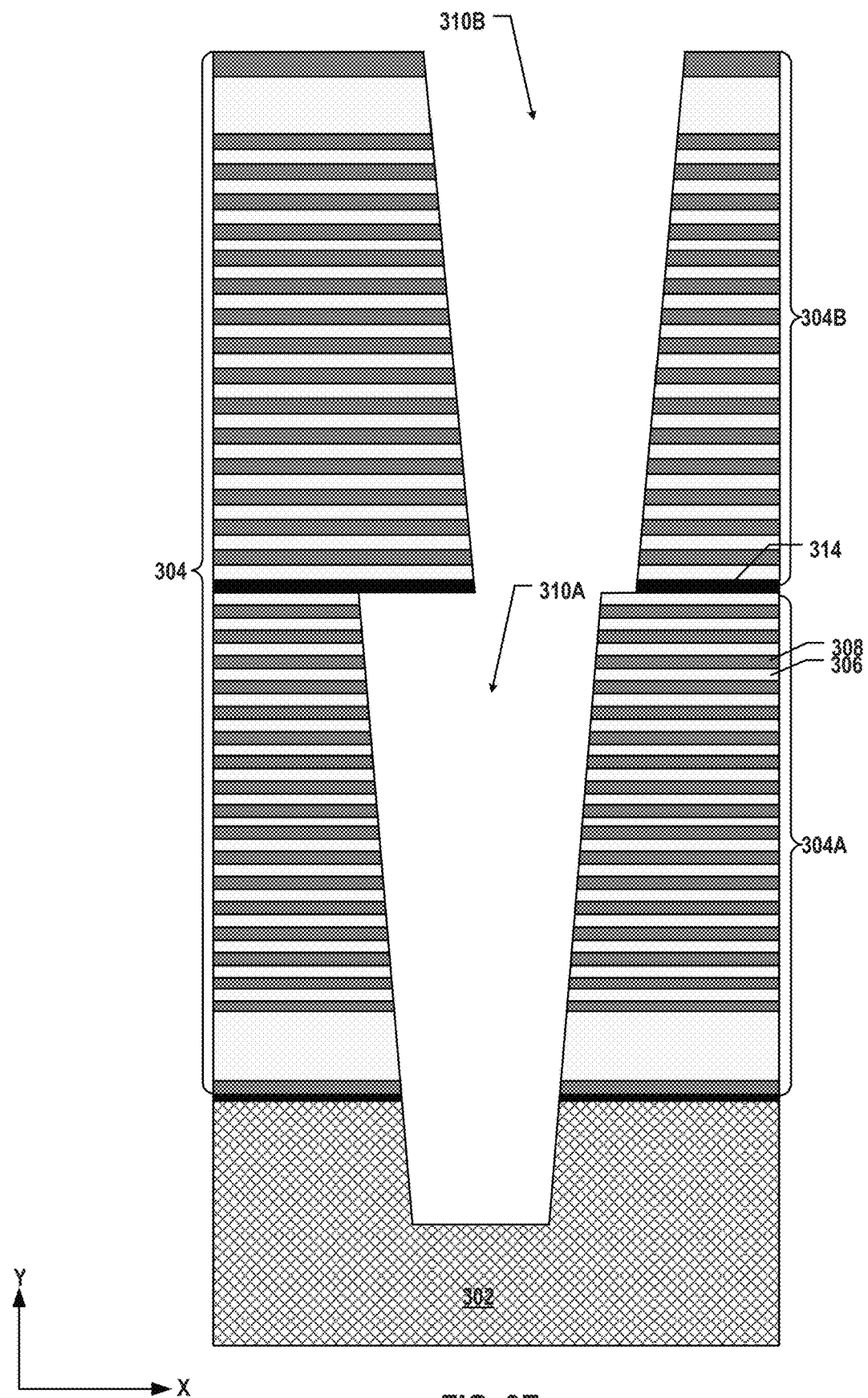

Method 400 proceeds to operation 412, as illustrated in FIG. 4A, in which part of the etch stop layer is removed, such that the first and second openings are connected to form a channel hole. In some embodiments, the sacrificial layer filling the first opening is exposed and removed after the removal of the part of etch stop layer. As illustrated in FIG. 3E, part of etch stop layer 314 in which first and second openings 310A and 310B are overlaid is removed, for example, using dry etching and/or wet etching processes. Additional part of etch stop layer 314 may be etched back (not shown) due to isotropic etching, for example, by wet etching. Once the part of etch stop layer 314 is removed, sacrificial layer 312 (shown in FIG. 3D) can be exposed from second channel hole 310B. As illustrated in FIG. 3E, sacrificial layer 312 is removed in first dielectric deck 304A by wet etching and/or dry etching processes. After the removal of sacrificial layer 312, first channel hole 310A becomes open again and connected with second channel hole 310B to form a channel hole 310, as shown in FIG. 3F, which extends vertically through first and second dielectric decks 304A and 304B and etch stop layer 314.

Method 400 proceeds to operation 414, as illustrated in FIG. 4A, in which a memory film and a semiconductor channel are formed along a sidewall and on a bottom surface of the channel hole. In some embodiments, the memory film is first formed along the sidewall and on the bottom surface of the channel hole, and a semiconductor channel is formed over the memory film. In some embodiments, a first silicon oxide layer, a silicon nitride layer, a second silicon oxide layer, and a polysilicon layer are subsequently deposited along the sidewall and on the bottom surface of the channel hole in this order to form the memory film and semiconductor channel. In some embodiments, a capping layer is deposited to fill the remaining space of the channel hole after the formation of the semiconductor channel.

Figure 3F:
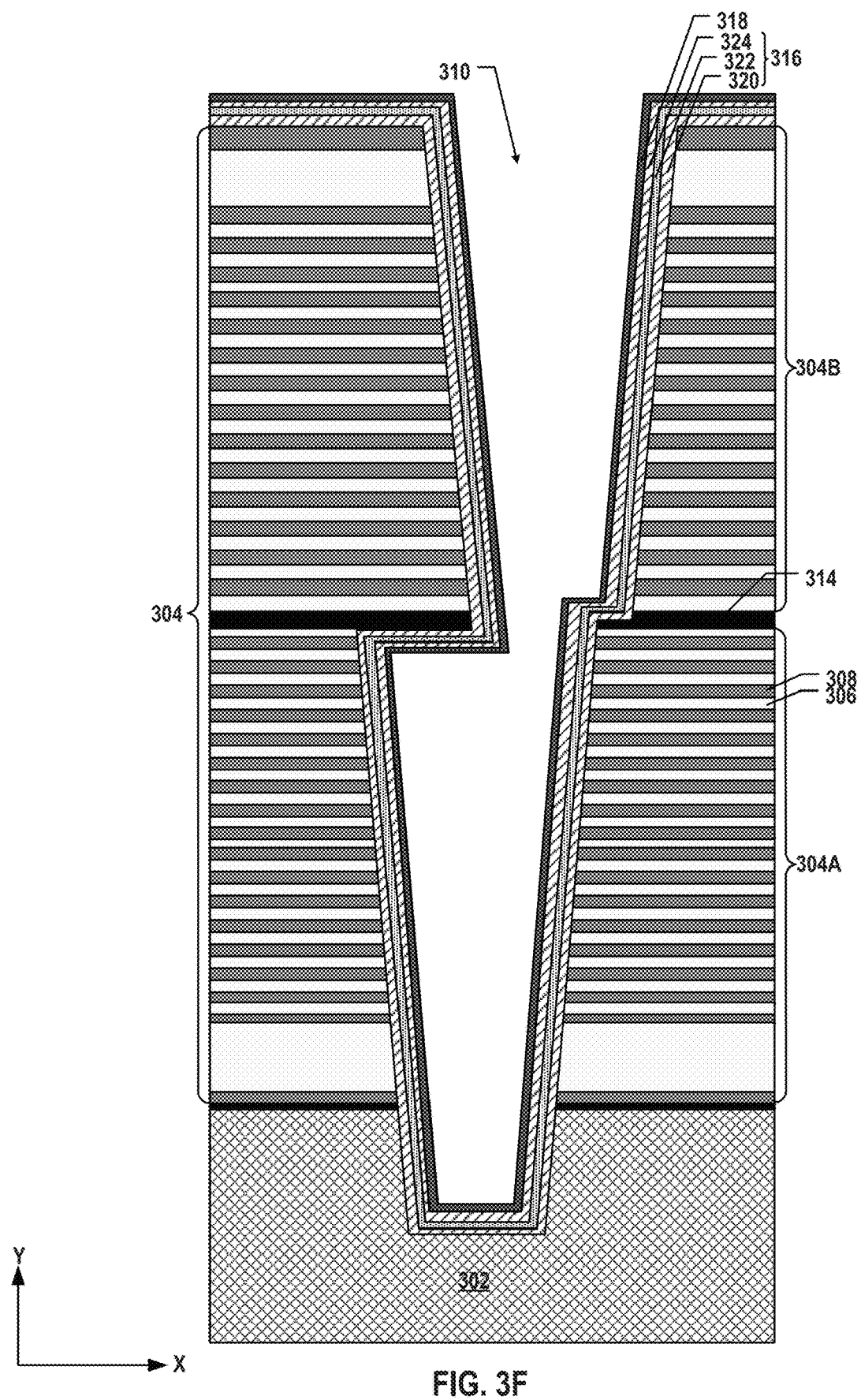

As illustrated in FIG. 3F, a memory film 316 (including a blocking layer 320, a storage layer 322, and a tunneling layer 324) and a semiconductor channel 318 are formed along the sidewall and bottom surface of channel hole 310. In some embodiments, memory film 316 is first deposited along the sidewall and bottom surface of channel hole 310, and semiconductor channel 318 is then deposited over memory film 316. Blocking layer 320, storage layer 322, and tunneling layer 324 can be subsequently deposited in this order using one or more thin film deposition processes, such as ALD, CVD, PVD, any other suitable processes, or any combination thereof, to form memory film 316. Semiconductor channel 318 can then be formed by depositing polysilicon or any other suitable semiconductor materials on tunneling layer 324 using one or more thin film deposition processes, such as ALD, CVD, PVD, any other suitable processes, or any combination thereof.

As shown in FIG. 3F, memory film 316 and semiconductor channel 318 can cover both the bottom surface and the sidewall of channel hole 310. In some embodiments, a silicon oxide layer, a silicon nitride layer, a silicon oxide layer, and a polysilicon layer (an "SONO" structure) are subsequently deposited to form memory film 316 and semiconductor channel 318. Different from some 3D memory devices (e.g., 3D memory device 100 in FIG. 1) using a channel sacrificial layer, which is later removed after the SONO punch process and before the deposition of a semiconductor channel, semiconductor channel 318 deposited over memory film 316 remains through all the later fabrication processes and in the resulting 3D memory device. In other words, a channel sacrificial layer is no long needed in the fabrication process disclosed herein.

Figure 3G:
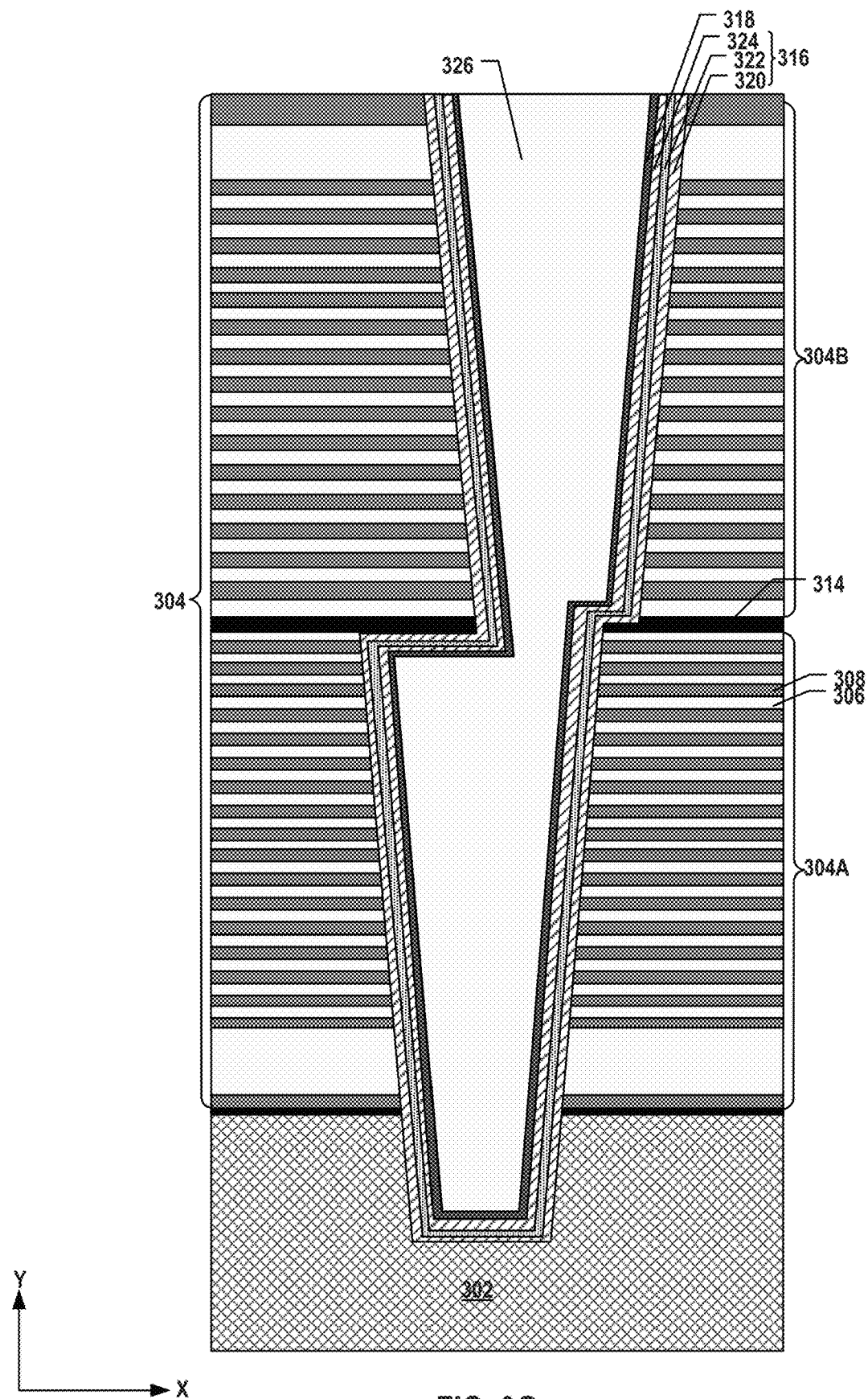

As illustrated in FIG. 3G, a capping layer 326, such as a silicon oxide layer, is formed in channel hole 310 (shown in FIG. 3F) to fully or partially fill the remaining space of channel hole 310 using one or more thin film deposition processes, such as CVD, PVD, ALD, electroplating, electroless plating, or any combination thereof. In some embodiments, parts of memory film 316, semiconductor channel 318, and capping layer 326 that are on the top surface of second dielectric deck 304B are removed and planarized by CMP, wet etching, and/or dry etching.

Figure 3H:
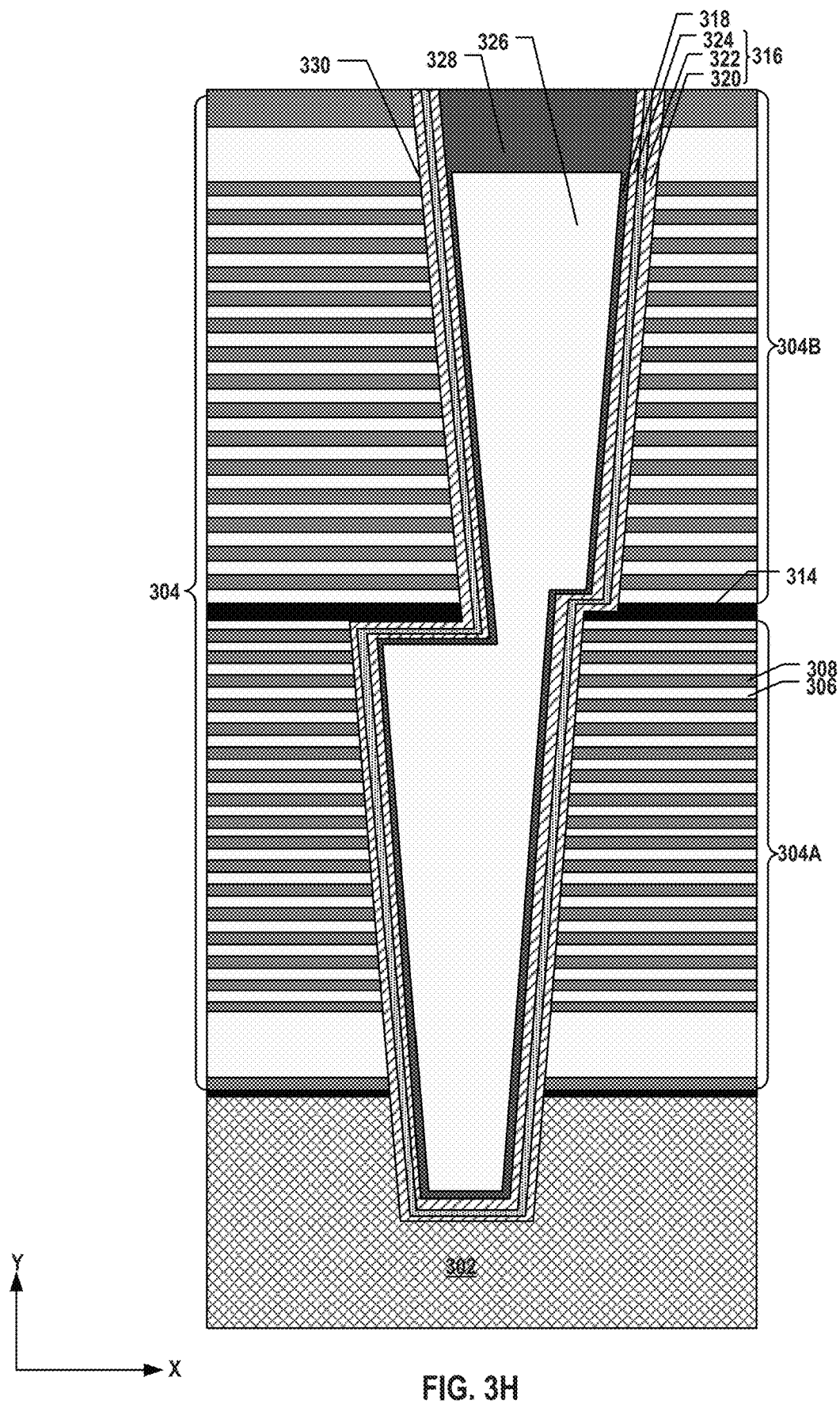

Method 400 proceeds to operation 416, as illustrated in FIG. 4B, in which a channel plug is formed in the upper portion of the channel hole to contact the semiconductor channel. As illustrated in FIG. 3H, a channel plug 328 is formed in the upper portion of channel hole 310 (shown in FIG. 3F). A recess can then be formed in the upper portion of channel hole 310 by wet etching and/or drying etching parts of memory film 316, semiconductor channel 318, and capping layer 326 in the upper portion of channel hole 310. Channel plug 328 can then be formed by depositing semiconductor materials, such as polysilicon, into the recess by one or more thin film deposition processes, such as CVD, PVD, ALD, electroplating, electroless plating, or any combination thereof. A channel structure 330 is thereby formed.

Method 400 proceeds to operation 418, as illustrated in FIG. 4B, in which a memory stack including interleaved conductive layers and dielectric layers is formed by replacing the sacrificial layers in the dielectric stack with the conductive layers. In some embodiments, to form the memory stack, a slit opening is formed through the dielectric stack. The gouging of the slit opening can be formed through part of the first substrate. In some embodiments, the depth of the gouging of the channel hole is greater than the depth of the gouging of the slit opening.

Figure 3I:
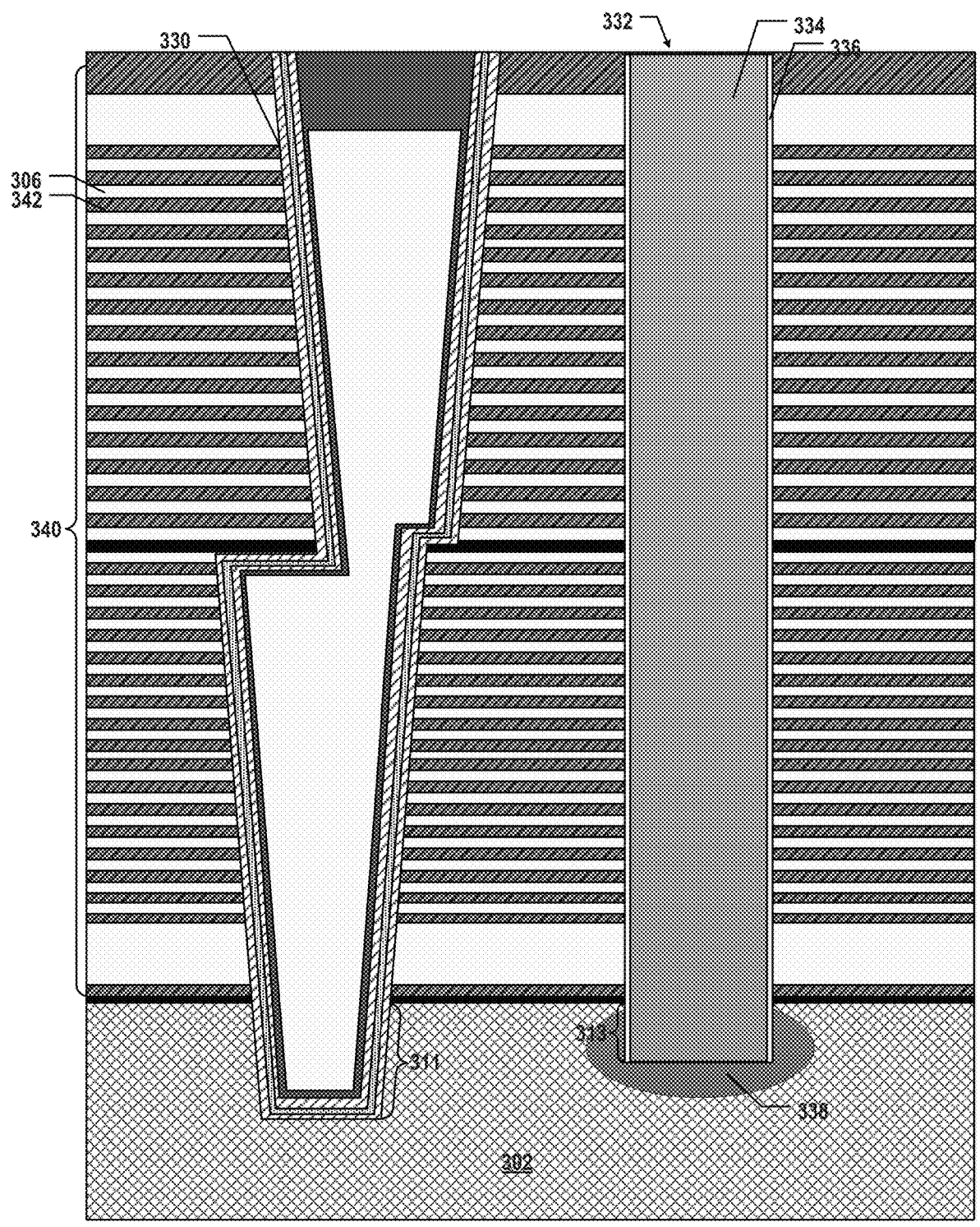

As illustrated in FIG. 3I. a slit opening (e.g., a gate line slit) is formed through dielectric stack 304 (including first and second dielectric decks 304A and 304B and etch stop layer 314 shown in FIG. 3H) using wet etching and/or dry etching process, such as DRIE. In some embodiments, a separate etching process is used to extend the slit opening into part of silicon substrate 302 to form a gouging 313 of the slit opening. The depth of gouging 311 of channel hole 310 can be greater than gouging 313 of the slit opening. In other words, the lower end of gouging 313 is farther away from the backside of silicon substrate 302 than the lower end of gouging 311. As a result, when thinning silicon substrate 302 from its backside in the later process, structure in gouging 313 of the slit opening would not be damaged when the thinning stopped at the lower end of gouging 311. Similarly, the depths of gougings of other openings (e.g., contact holes) through the front side of silicon substrate 302 are smaller than the depth of gouging 311 of channel hole 310.

As illustrated in FIG. 3I, a dual-deck memory stack 340 including interleaved conductive layers 342 and dielectric layer 306 is formed by a gate replacement process. Sacrificial layers 308 in dielectric stack 304 (shown in FIG. 3H) can be etched away using wet etching and/or drying etching processes. The replacement of sacrificial layers 308 with conductive layers 342 can be performed by wet etching and/or drying etching of sacrificial layers 308 selective to dielectric layers 306 and filling the resulting lateral recesses with conductive layers 342. In some embodiments, wet etchants are applied through the slit opening to remove sacrificial layers 308, leaving lateral recesses between dielectric layers 306. The lateral recesses can be filled with conductive materials including, but not limited to, W, Co, Cu, Al, doped silicon, polysilicon, silicides, or any combination thereof. Conductive layers 342 can be filled by one or more thin film deposition processes, such as CVD, ALD, PVD, any other suitable process, or any combination thereof. The conductive materials can be deposited into the lateral recesses through the slit opening.

As illustrated in FIG. 3I, a slit structure 332 (e.g., a gate line slit, "GLS") extending vertically through memory stack 340 and part of silicon substrate 302 is formed. Slit structure 332 can include a doped region 338 at its lower end in silicon substrate 302, a spacer 336 along its sidewall, and a slit contact 334 electrically insulated from conductive layers 342 by spacer 336. In some embodiments, doped region 338 is formed by ion implantation and/or thermal diffusion to dope part of silicon substrate 302 surrounding gouging 313 of the slit opening. In some embodiments, spacer 336 and slit contact 334 are formed by subsequently depositing dielectric materials (e.g., silicon oxide) and conductive materials (e.g., tungsten) in the slit opening by one or more thin film deposition processes, such as CVD, ALD, PVD, any other suitable process, or any combination thereof.

Method 400 proceeds to operation 420, as illustrated in FIG. 4B, in which the first substrate is attached to a second substrate. The front side of the first substrate is toward the second substrate. In some embodiments, a peripheral device is formed on the second substrate prior to the attachment. In some embodiments, the second substrate is a carrier substrate without any device formed thereon.

Figure 3J:
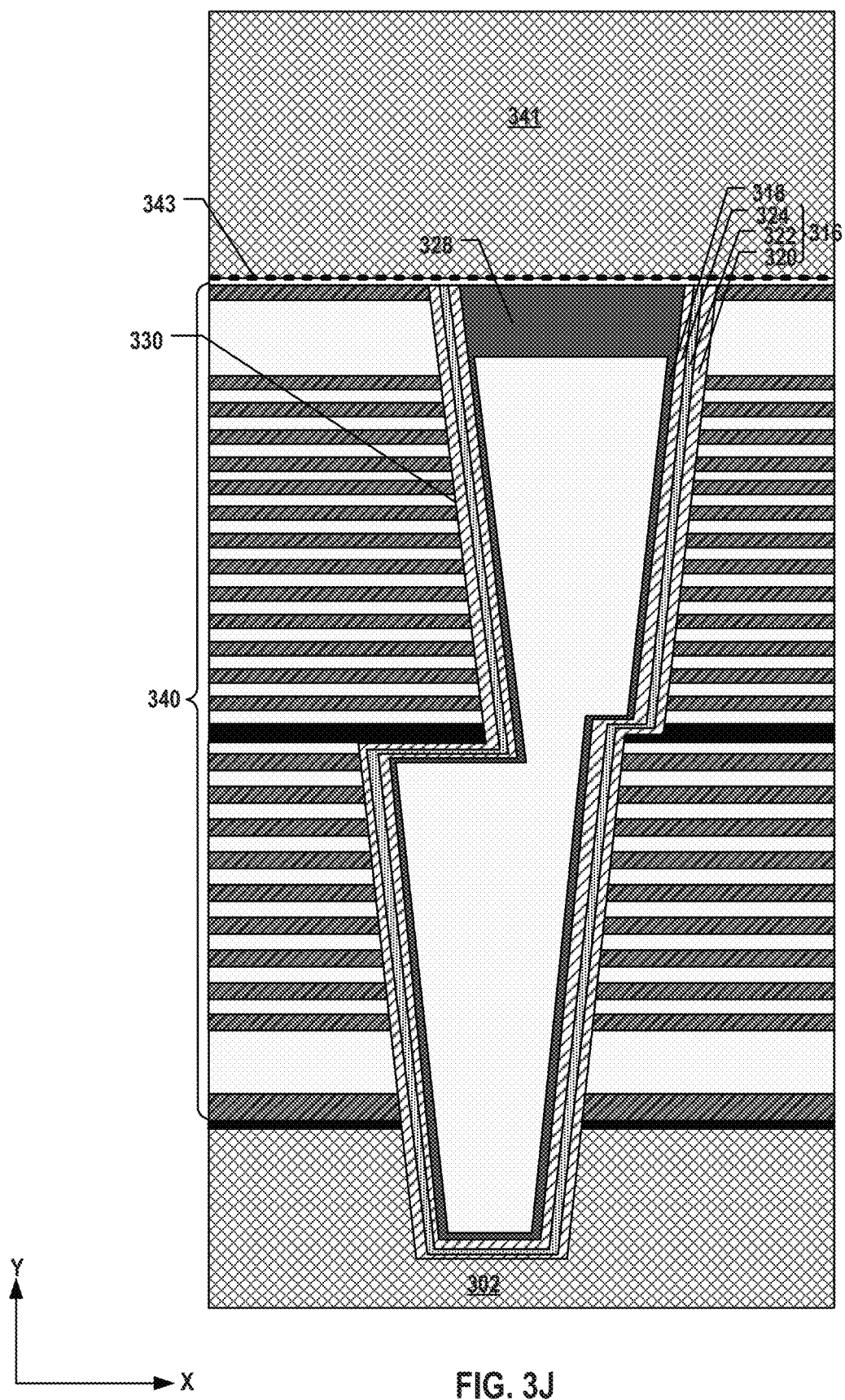

As illustrated in FIG. 3J, once all the front side processes are finished on silicon substrate 302, i.e., all the devices and structures on the front side of silicon substrate 302 have been formed, the structures and devices (e.g., memory stack 340 and channel structure 330) formed on the front side of silicon substrate 302 are attached to a substrate 341 at a joining interface 343 using any suitable joining processes. That is, the front side of silicon substrate 302 is toward substrate 341 when silicon substrate 302 is attached to substrate 341, according to some embodiments. In some embodiments, substrate 341 is a carrier substrate without any devices or structures formed thereon. The front side of silicon substrate 302 can be attached to the carrier substrate (e.g., a bare silicon wafer) using thermal bonding, adhesion, fusion, any other suitable process, or any combination thereof.

In some embodiments, a peripheral device (not shown), such as transistors, is formed on or in substrate 341 prior to the attachment by a plurality of processes including, but not limited to, photolithography, dry etching, wet etching, thin film deposition, thermal growth, implantation, CMP, and any other suitable processes. Substrate 341 with the peripheral device can be bonded with silicon substrate 302 using hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. The metal-metal bonding can be formed between bonding contacts at joining interface 343, and the dielectric-dielectric bonding can be formed between the dielectric materials at the remaining areas at joining interface 343.

Figure 3K:
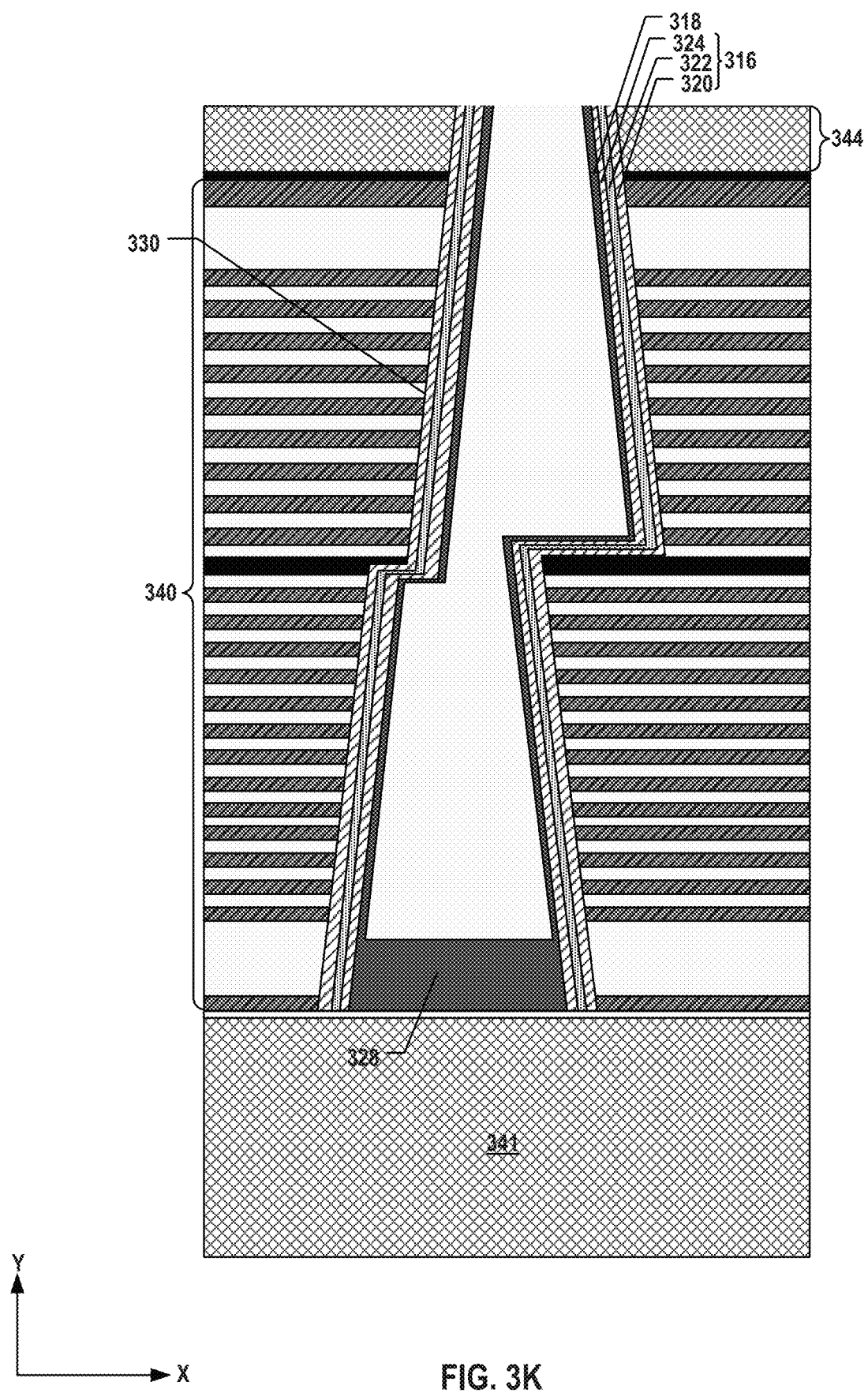

Method 400 proceeds to operation 422, as illustrated in FIG. 4B, in which the first substrate is thinned from the backside to remove parts of the memory film and semiconductor channel on the bottom surface of the channel hole. As illustrated in FIG. 3K, the resulting structure including attached silicon substrate 302 and substrate 341 is flipped upside down, such that the backside of silicon substrate 302 can face up for the backside thinning process and substrate 341 can support the resulting structure during the thinning process. Silicon substrate 302 can be thinned from its backside (now facing up) using grinding, CMP, etching, any other suitable process, or any combination thereof to reduce its thickness. The rate and/or time of the thinning process can be controlled, such that parts of memory film 316 and semiconductor channel 318 on the bottom surface of channel hole 310 of channel structure 330 are removed after the thinning process. It is noted that because memory stack 340 is flipped upside down, the bottom surface of channel structure 330 becomes the top surface in FIG. 3K and later figures. Nevertheless, this is the surface opposite to the surface on which channel plug 328 is formed and is the surface on which memory film 316 and semiconductor channel 318 extend laterally. Once the thinning process is completed, memory film 316 and semiconductor channel 318 do not have any parts that extend laterally on the bottom surface or top surface of channel structure 330. A semiconductor layer 344 is thereby formed as the thinned silicon substrate 302 after the backside substrate thinning process.

Figure 3L:
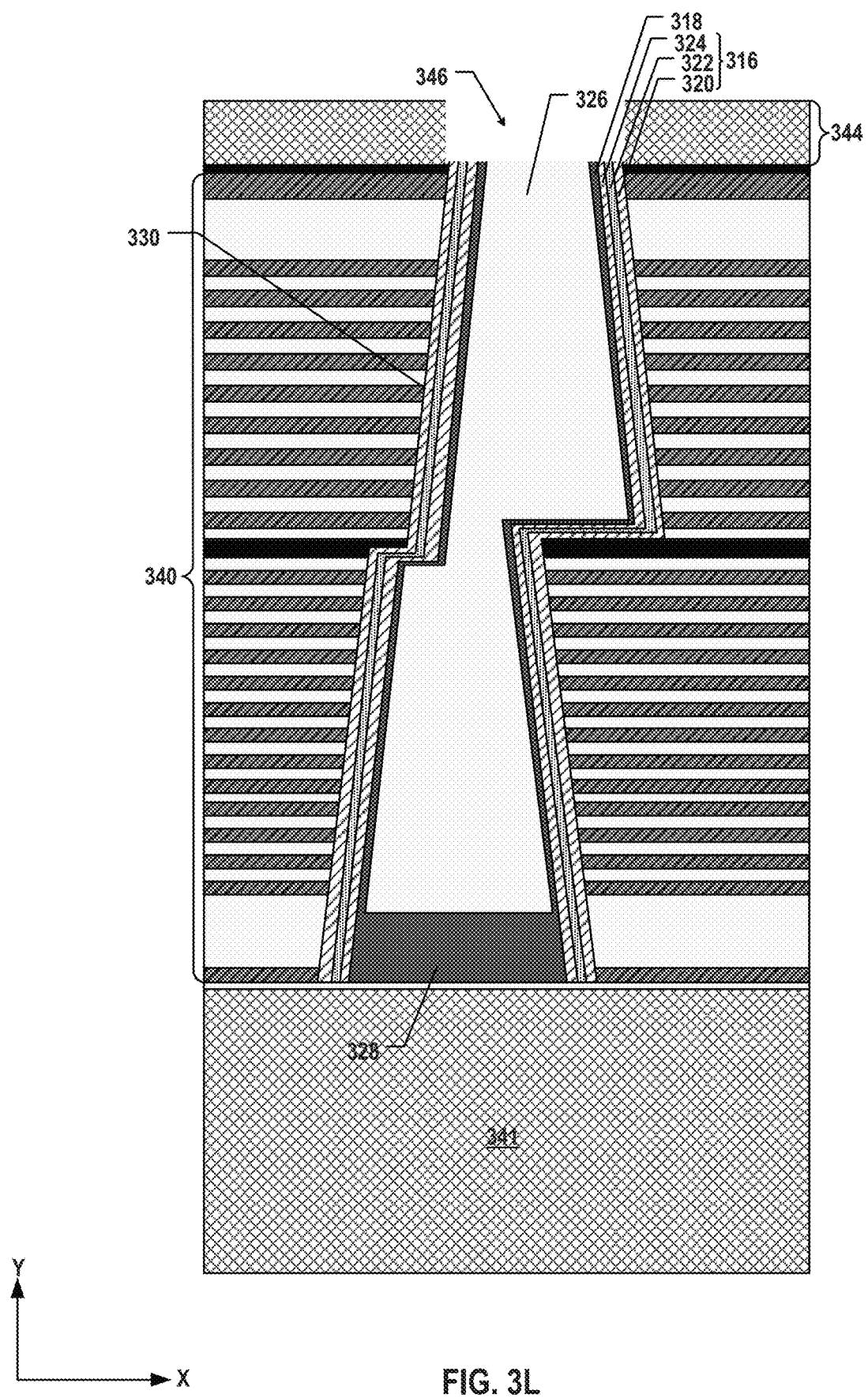

Method 400 proceeds to operation 424, as illustrated in FIG. 4B, in which parts of the memory film and semiconductor channel in the thinned first substrate are removed using wet etching and/or dry etching processes to form a recess. As illustrated in FIG. 3L, a recess 346 is formed in semiconductor layer 344 by removing parts of memory film 316, semiconductor channel 318, and capping layer 326 in semiconductor layer 344. In some embodiments, part of semiconductor layer 344 surrounding memory film 316 is removed as well. The etching rate and/or time can be controlled to control the depth of recess 346. In some embodiments, the bottom surface of recess 346 and the upper ends of memory film 316 and semiconductor channel 318 are above the top surface of memory stack 340, as shown in FIG. 3L.

Method 400 proceeds to operation 426, as illustrated in FIG. 4B, in which a semiconductor plug is formed in the recess of the thinned first substrate to contact the semiconductor channel. The semiconductor plug can be epitaxially grown from the thinned first substrate. In some embodiments, the semiconductor is formed by depositing the semiconductor plug in the recess.

Figure 3M:
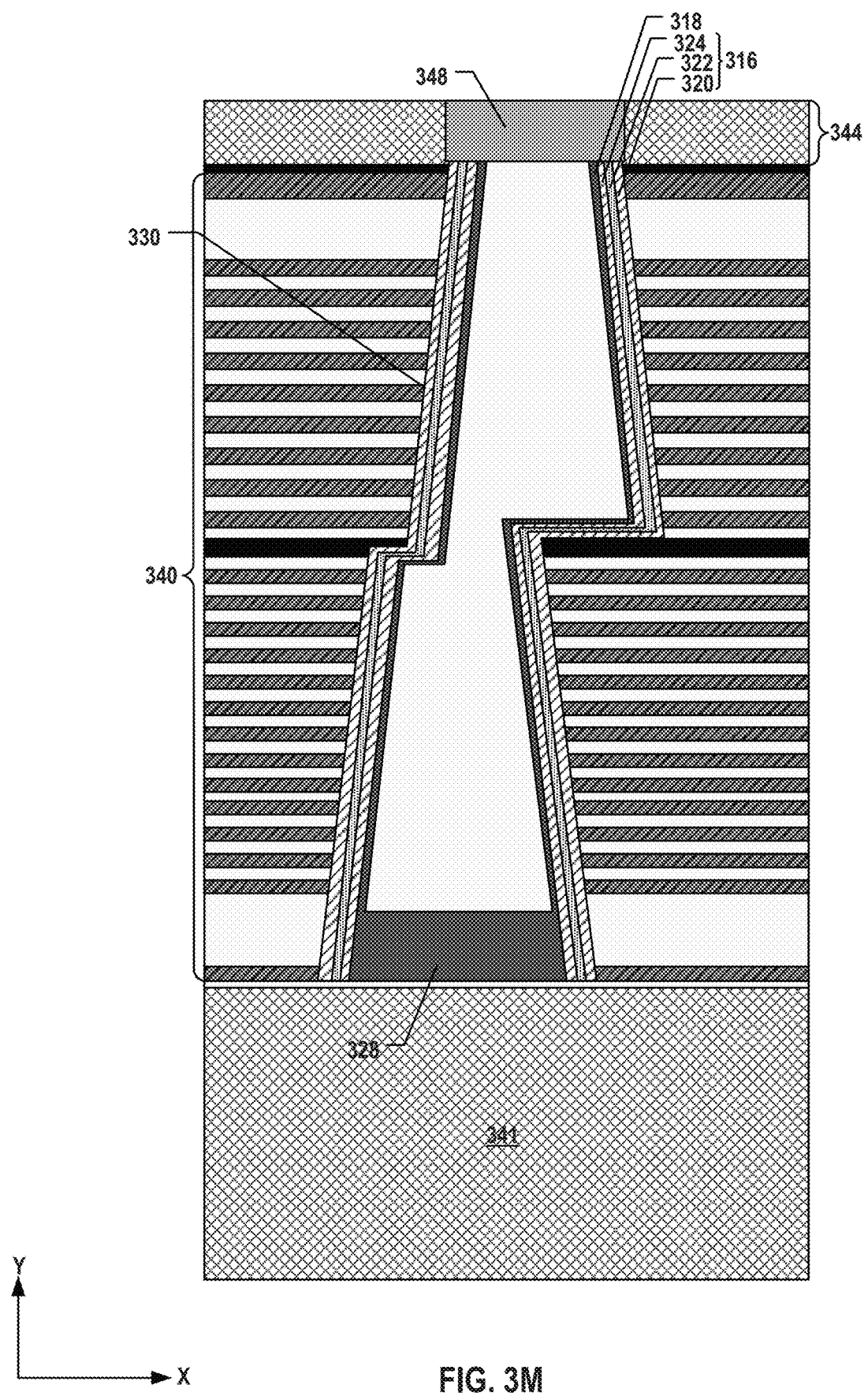

As illustrated in FIG. 3M, in some embodiments, a semiconductor plug 348 is formed by filling recess 346 (shown in FIG. 3L) with single crystalline silicon epitaxially grown from semiconductor layer 344 (thinned silicon substrate 302) from its side surfaces. The fabrication processes for forming epitaxially semiconductor plug 348 can include, but not limited to, vapor-phase epitaxy (VPE), liquid-phase epitaxy (LPE), molecular-beam epitaxy (MPE), or any combinations thereof. In some embodiments, semiconductor plug 348 is doped with n-type or n-type dopants to a doping concentration greater than semiconductor layer 344 using ion implantation and/or thermal diffusion.

In some embodiments, semiconductor plug 348 is formed by depositing a layer of semiconductor into recess 346, such as a polysilicon layer, using one or more thin film deposition processes, such as CVD, ALD, PVD, any other suitable process, or any combination thereof. In some embodiments, semiconductor plug 348 is formed by a salicide process, i.e., deposition a layer of metal into recess 346 and silicidation of the silicon in semiconductor layer 344 and the deposited metal layer by a thermal treatment (e.g., annealing, sintering, or any other suitable process). In some embodiments, both a silicon layer and a metal layer are deposited into recess 346 to form a silicide plug in recess by a silicidation process. Once semiconductor plug 348 is formed in recess 346, it can contact channel structure 330 including semiconductor channel 318. In some embodiments in which the bottom surface of recess 346 is above the top surface of memory stack 340, the bottom surface of semiconductor plug 348 filling recess 346 is above the top surface of memory stack 340 as well.

Once the semiconductor plug is formed in the thinned first substrate, additional structures can be formed above the thinned first substrate. In some embodiments, a peripheral device and/or an interconnect layer formed on a separate substrate is bonded with the structure shown in FIG. 3M in a face-to-face manner to form a non-monolithic 3D memory device in which the peripheral device is disposed above the memory array device. In some embodiments, substrate 341 is a carrier substrate that can be removed and replaced with another substrate having a peripheral device and/or an interconnect layer to form a non-monolithic 3D memory device in which the peripheral device is disposed below the memory array device. In some embodiments, substrate 341 is the substrate of a peripheral device, so that the structure shown in FIG. 3M is a non-monolithic 3D memory device in which the peripheral device is disposed below the memory array device.

According to one aspect of the present disclosure, a 3D memory device includes a memory stack including interleaved conductive layers and dielectric layers, a channel structure extending vertically through the memory stack, and a semiconductor layer above the memory stack. The channel structure includes a channel plug in a lower portion of the channel structure, a memory film along a sidewall of the channel structure, and a semiconductor channel over the memory film and in contact with the channel plug. The semiconductor layer includes a semiconductor plug above and in contact with the semiconductor channel.

In some embodiments, the memory film does not extend along a top surface and a bottom surface of the channel structure.

In some embodiments, the semiconductor layer includes single crystalline silicon. The semiconductor plug can be an epitaxially-grown silicon plug. The semiconductor plug can be also a deposited polysilicon plug or a silicide plug.

In some embodiments, the 3D memory device further includes a substrate above which the memory stack is disposed, and a joining interface vertically between the substrate and the memory stack. In some embodiments, the 3D memory device further includes a peripheral device above the semiconductor layer. In some embodiments, the 3D memory device further includes a peripheral device vertically between the substrate and the memory stack.

According to another aspect of the present disclosure, a 3D memory device includes a first memory deck including a first plurality of interleaved conductive layers and dielectric layers, an etch stop layer on the first memory deck, a second memory deck including a second plurality of interleaved conductive layers and dielectric layers on the etch stop layer, a channel structure extending vertically through the first and second memory decks and the etch stop layer, and a semiconductor plug above a top surface of the second memory deck and in contact with the channel structure.

In some embodiments, the etch stop layer includes a metal or a semiconductor.

In some embodiments, the channel structure includes a channel plug in a lower portion of the channel structure, a memory film along a sidewall of the channel structure, and a semiconductor channel over the memory film and in contact with the channel plug and the semiconductor plug.

In some embodiments, the memory film does not extend along a top surface and a bottom surface of the channel structure.

In some embodiments, an upper end of the semiconductor channel is in contact with a bottom surface of the semiconductor plug.

In some embodiments, the semiconductor plug is an epitaxially-grown silicon plug. In some embodiments, the semiconductor plug is a deposited polysilicon plug or a silicide plug.

In some embodiments, the 3D memory device includes a substrate above which the first memory deck is disposed; and a joining interface vertically between the substrate and the first memory deck. In some embodiments, the 3D memory device includes a peripheral device above the semiconductor plug. In some embodiments, the 3D memory device includes a peripheral device vertically between the substrate and the first memory deck.

According to still another aspect of the present disclosure, a method for forming a 3D memory device is disclosed. A dielectric stack including interleaved sacrificial layers and dielectric layers is formed on a front side of a first substrate. A channel hole is formed through the dielectric stack. A memory film and a semiconductor channel are formed along a sidewall and on a bottom surface of the channel hole. A memory stack including interleaved conductive layers and dielectric layers is formed by replacing the sacrificial layers in the dielectric stack with the conductive layers. The first substrate is attached to a second substrate. The front side of the first substrate is toward the second substrate. The first substrate is thinned from a backside of the first substrate to remove parts of the memory film and semiconductor channel on the bottom surface of the channel hole. A semiconductor plug is formed in the thinned first substrate to contact the semiconductor channel.

In some embodiments, prior to attaching, a channel plug is formed in an upper portion of the channel hole to contact the semiconductor channel.

In some embodiments, to form the semiconductor plug, parts of the memory film and semiconductor channel in the thinned first substrate are removed to form a recess. The semiconductor plug can be deposited in the recess or epitaxially grown in the recess from the thinned first substrate.

In some embodiments, to form the dielectric stack, a first dielectric deck including a first plurality of interleaved sacrificial layers and dielectric layers are formed on the frontside of the first substrate, an etch stop layer is formed on the first dielectric deck to cover the first dielectric deck, and a second dielectric deck including a second plurality of interleaved sacrificial layers and dielectric layers is formed on the etch stop layer.

In some embodiments, to form the channel hole, a first opening extending vertically through the first dielectric deck is formed, a second opening extending vertically through the second dielectric deck is formed until being stopped by the etch stop layer, and part of the etch stop layer is removed, such that the first and second openings are connected to form the channel hole.

In some embodiments, to form the channel hole, a gouging of the channel hole is formed through part of the first substrate. In some embodiments, a slit opening is formed through the dielectric stack, and a gouging of the slit opening is formed through part of the first substrate. A depth of the gouging of the channel hole is greater than a depth of the gouging of the slit opening.

In some embodiments, prior to attaching, a peripheral device is formed on the second substrate. In some embodiments, after forming the semiconductor plug, a peripheral device is formed above the thinned first substrate.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a memory stack comprising interleaved conductive layers and dielectric layers;
   a channel structure extending vertically through the memory stack and comprising:
      a channel plug in a lower portion of the channel structure;
      a memory film along a sidewall of the channel structure; and
      a semiconductor channel over the memory film and in contact with the channel plug; and
   a semiconductor layer above the memory stack and comprising a semiconductor plug above and in contact with the semiconductor channel, wherein a top surface of the semiconductor plug is flush with a top surface of the semiconductor layer.

2. The 3D memory device of claim 1, wherein the memory film does not extend along a top surface and a bottom surface of the channel structure.

3. The 3D memory device of claim 1, wherein the semiconductor layer comprises single crystalline silicon.

4. The 3D memory device of claim 3, wherein the semiconductor plug is an epitaxially-grown silicon plug.

5. The 3D memory device of claim 3, wherein the semiconductor plug is a deposited polysilicon plug or a silicide plug.

6. The 3D memory device of claim 1, wherein an upper end of the semiconductor channel is in contact with a bottom surface of the semiconductor plug.

7. The 3D memory device of claim 1, wherein a bottom surface of the semiconductor plug is above a top surface of the memory stack.

8. The 3D memory device of claim 1, further comprising
a substrate above which the memory stack is disposed; and
a joining interface vertically between the substrate and the memory stack.

9. The 3D memory device of claim 1, further comprising a peripheral device above the semiconductor layer.

10. The 3D memory device of claim 8, further comprising a peripheral device vertically between the substrate and the memory stack.

11. A three-dimensional (3D) memory device, comprising:
a first memory deck comprising a first plurality of interleaved conductive layers and dielectric layers;
an etch stop layer on the first memory deck;
a second memory deck comprising a second plurality of interleaved conductive layers and dielectric layers on the etch stop layer;
a channel structure extending vertically through the first and second memory decks and the etch stop layer; and
a semiconductor plug above a top surface of the second memory deck and in contact with the channel structure, wherein a top surface of the semiconductor plug is flush with a top surface of the semiconductor layer.

12. The 3D memory device of claim 11, wherein the etch stop layer comprises a metal or a semiconductor.

13. The 3D memory device of claim 11, the channel structure comprises:
a channel plug in a lower portion of the channel structure;
a memory film along a sidewall of the channel structure; and
a semiconductor channel over the memory film and in contact with the channel plug and the semiconductor plug.

14. A method for forming a three-dimensional (3D) memory device, comprising:

forming a dielectric stack comprising interleaved sacrificial layers and dielectric layers on a front side of a first substrate;
forming a channel hole through the dielectric stack;
forming a memory film and a semiconductor channel along a sidewall and on a bottom surface of the channel hole;
forming a memory stack comprising interleaved conductive layers and dielectric layers by replacing the sacrificial layers in the dielectric stack with the conductive layers;
attaching the first substrate to a second substrate, wherein the front side of the first substrate is toward the second substrate;
thinning the first substrate from a backside of the first substrate to remove parts of the memory film and semiconductor channel on the bottom surface of the channel hole; and
forming a semiconductor plug in the thinned first substrate to contact the semiconductor channel.

15. The method of claim 14, further comprising, prior to attaching, forming a channel plug in an upper portion of the channel hole to contact the semiconductor channel.

16. The method of claim 14, wherein forming the semiconductor plug comprises removing parts of the memory film and semiconductor channel in the thinned first substrate to form a recess.

17. The method of claim 16, wherein forming the semiconductor plug further comprises depositing the semiconductor plug in the recess.

18. The method of claim 16, wherein forming the semiconductor plug further comprises epitaxially growing the semiconductor plug in the recess from the thinned first substrate.

19. The method of claim 14, wherein forming the dielectric stack comprises:
forming a first dielectric deck comprising a first plurality of interleaved sacrificial layers and dielectric layers on the frontside of the first substrate;
forming an etch stop layer on the first dielectric deck to cover the first dielectric deck; and
forming a second dielectric deck comprising a second plurality of interleaved sacrificial layers and dielectric layers on the etch stop layer.

20. The method of claim 14, further comprising:
prior to attaching, forming a peripheral device on the second substrate; or
after forming the semiconductor plug, forming a peripheral device above the thinned first substrate.

* * * * *